(12) United States Patent
Wu et al.

(10) Patent No.: US 12,439,792 B2
(45) Date of Patent: Oct. 7, 2025

(54) DISPLAY SUBSTRATE AND MANUFACTURING METHOD THEREFOR, AND DISPLAY DEVICE

(71) Applicants: Hefei BOE Joint Technology Co., Ltd., Anhui (CN); BOE Technology Group Co., Ltd., Beijing (CN)

(72) Inventors: Liu Wu, Beijing (CN); Zhidong Yuan, Beijing (CN); Yongqian Li, Beijing (CN); Can Yuan, Beijing (CN); Chuanchuan Chang, Beijing (CN); Jun Liu, Beijing (CN); Tao Sun, Beijing (CN)

(73) Assignees: HEFEI BOE JOINT TECHNOLOGY CO., LTD., Anhui (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 18/245,134

(22) PCT Filed: Mar. 25, 2022

(86) PCT No.: PCT/CN2022/083142
§ 371 (c)(1),
(2) Date: Mar. 13, 2023

(87) PCT Pub. No.: WO2023/178673
PCT Pub. Date: Sep. 28, 2023

(65) Prior Publication Data
US 2024/0306457 A1  Sep. 12, 2024

(51) Int. Cl.
*H10K 59/131*  (2023.01)
*H10K 59/12*  (2023.01)
*H10K 59/88*  (2023.01)

(52) U.S. Cl.
CPC ..... *H10K 59/1315* (2023.02); *H10K 59/1201* (2023.02); *H10K 59/88* (2023.02)

(58) Field of Classification Search
CPC . H10K 59/1315; H10K 59/1201; H10K 59/88
(Continued)

(56) References Cited

U.S. PATENT DOCUMENTS

| 2008/0018583 | A1 | 1/2008 | Knapp et al. |
| 2009/0102824 | A1* | 4/2009 | Tanaka ................. G09G 3/3648 345/55 |

(Continued)

FOREIGN PATENT DOCUMENTS

| CN | 1378266 A | 11/2002 |
| CN | 1961251 A | 5/2007 |

(Continued)

*Primary Examiner* — Xia L Cross
(74) *Attorney, Agent, or Firm* — Workman Nydegger

(57) ABSTRACT

A display substrate and a manufacturing method therefor, and a display device. The display substrate includes: a base substrate including a special-shaped display area and a frame area located on one side of the special-shaped display area; and the special-shaped display area includes a first display area and a second display area on located on one side of the first display area, and the second display area is arranged in contact with the frame area; a group of data lines located on the base substrate and located in the first display area and the second display area; a group of fan-out lines located on a side of a layer where the group of data lines are located away from the base substrate, located in the first display area, and electrically connected to the data lines; and a group of dummy leads.

20 Claims, 27 Drawing Sheets

(58) Field of Classification Search
USPC .......................................................... 257/72
See application file for complete search history.

(56) References Cited

U.S. PATENT DOCUMENTS

| | | |
|---|---|---|
| 2019/0051718 A1 | 2/2019 | Zhang et al. |
| 2019/0278145 A1 | 9/2019 | Tanaka et al. |
| 2020/0075640 A1 | 3/2020 | Song et al. |
| 2020/0144298 A1* | 5/2020 | Tao ........................ H10K 59/12 |
| 2021/0027717 A1 | 1/2021 | Kim |
| 2021/0132722 A1* | 5/2021 | Kim ........................ H01Q 1/22 |
| 2023/0043145 A1 | 2/2023 | Yuan et al. |

FOREIGN PATENT DOCUMENTS

| | | |
|---|---|---|
| CN | 101101390 A | 1/2008 |
| CN | 107703688 A | 2/2018 |
| CN | 108445686 A | 8/2018 |
| CN | 108598139 A | 9/2018 |
| CN | 108831302 A | 11/2018 |
| CN | 109148485 A | 1/2019 |
| CN | 109541865 A | 3/2019 |
| CN | 109791745 A | 5/2019 |
| CN | 110176465 A | 8/2019 |
| CN | 111258456 A | 6/2020 |
| CN | 111258459 A | 6/2020 |
| CN | 112310125 A | 2/2021 |
| CN | 212725309 U | 3/2021 |
| CN | 113160743 A | 7/2021 |
| CN | 113223409 A | 8/2021 |
| JP | 2018040966 A | 3/2018 |

\* cited by examiner

DISPLAY SUBSTRATE AND MANUFACTURING METHOD THEREFOR, AND DISPLAY DEVICE

CROSS REFERENCE TO RELATED APPLICATIONS

The present disclosure is a US National Stage of International Application No. PCT/CN2022/083142, filed on Mar. 25, 2022, the entire contents of which are incorporated herein by reference.

FIELD OF INVENTION

The disclosure relates to the field of display technology, and in particular, to a display substrate and a manufacturing method therefor, and a display device.

BACKGROUND

With the advent of the 5G era, the Internet of Everything is no longer out of reach. As a window of the Internet of Everything, the display industry is also facing more difficulties and challenges while enjoying huge market dividends.

SUMMARY

Embodiment of the disclosure provides a display substrate and a manufacturing method therefor, and a display device. The specific solutions are as follows.

In one aspect, an embodiment of the disclosure provides a display substrate, including:
- a base substrate including a special-shaped display area and a frame area located on at least one side of the special-shaped display area; where the special-shaped display area includes a first display area and a second display area located on at least one side of the first display area, and the second display area is arranged in contact with the frame area;
- a data line located on the base substrate and located in the first display area and the second display area;
- a plurality of fan-out lines located on a side of a layer where the data line is located away from the base substrate, and located in the first display area, where at least one of the plurality of fan-out lines is electrically connected to the data line; and
- a plurality of dummy leads arranged in a same layer as the plurality of fan-out lines and located in the second display area, where a ratio of a distribution density of the plurality of dummy leads in the second display area to a distribution density of the plurality of fan-out lines in the first display area satisfies a preset threshold.

In some embodiments, in the above display substrate according to the embodiment of the disclosure, the preset threshold is greater than or equal to 0.5 and less than or equal to 1.5.

In some embodiments, in the above display substrate according to the embodiment of the disclosure, the preset threshold is greater than or equal to 0.8 and less than or equal to 1.2.

In some embodiments, in the above display substrate according to the embodiment of the disclosure, the preset threshold is 1.

In some embodiments, the above display substrate according to the embodiment of the disclosure further includes: a first power line located in the frame area and electrically connected to the plurality of dummy leads.

In some embodiments, in the above display substrate according to the embodiment of the disclosure, the first power line and the plurality of dummy leads form a closed loop.

In some embodiments, the above display substrate according to the embodiment of the disclosure further includes a connection line arranged in a same layer as the plurality of dummy leads, where the plurality of dummy leads form a closed loop with the first power line through the connection line.

In some embodiments, in the above display substrate according to the embodiment of the disclosure, the first power line is located at least in a layer where the plurality of dummy leads are located, and the first power line is integral with the plurality of dummy leads.

In some embodiments, the above display substrate according to the embodiment of the disclosure further includes a gate drive circuit located in the special-shaped display area.

In some embodiments, in the above display substrate according to the embodiment of the disclosure, the gate drive circuit includes a plurality of shift registers arranged in cascade, and the plurality of shift registers are symmetrically arranged about a center axis of the special-shaped display area in a column direction.

In some embodiments, the above display substrate according to the embodiment of the disclosure further includes a plurality of sub-pixels arranged in an array in the special-shaped display area; where the plurality of shift registers are arranged in cascade at row gaps of rows of the sub-pixels along the column direction.

In some embodiments, the above display substrate according to the embodiment of the disclosure further includes a plurality of gate drive signal lines located in the first display area and the second display area and configured to provide control signals to the gate drive circuit.

In some embodiments, in the above display substrate according to the embodiment of the disclosure, the plurality of fan-out lines include fan-out line segments with a substantially same extending direction as the data line, and an extending direction of the plurality of gate drive signal lines is substantially same as an extending direction of the data line; and
- orthographic projections of the fan-out line segments on the base substrate do not overlap with orthographic projections of the plurality of gate drive signal lines on the base substrate.

In some embodiments, in the above display substrate according to the embodiment of the disclosure, an extending direction of the plurality of dummy leads is substantially same as the extension direction of the data line; and
- orthographic projections of the plurality of dummy leads on the base substrate do not overlap with the orthographic projections of the plurality of gate drive signal lines on the base substrate.

In some embodiments, the above display substrate according to the embodiment of the disclosure further includes a plurality of sub-pixels arranged in an array in the special-shaped display area, where each column of the sub-pixels includes an edge area adjacent to a column gap;
- the gate drive signal lines are located at some column gaps of columns of the sub-pixels;
- in the first display area, the orthographic projections of the fan-out line segments on the base substrate at least partially overlap with orthographic projections of edge areas on the base substrate, and the orthographic projections of the fan-out line segments on the base substrate at least partially overlap with orthographic projections of other column gaps than the some column gaps on the base substrate; and in the second display area, the orthographic projections of the plurality of dummy leads on the base substrate at least partially overlap with the orthographic projections of the edge areas on the base substrate, and the orthographic projections of the plurality of dummy leads on the base substrate at least partially overlap with the orthographic projections of other column gaps than the some column gaps on the base substrate.

In some embodiments, in the above display substrate according to the embodiment of the disclosure, in the first display area, the orthographic projections of the fan-out line segments on the base substrate are substantially evenly distributed among the orthographic projections of the gate drive signal lines on the base substrate; and in the second display area, the orthographic projections of the dummy leads on the base substrate are substantially evenly distributed among the orthographic projections of the gate drive signal lines on the base substrate.

In some embodiments, in the above display substrate according to the embodiment of the disclosure, the plurality of fan-out lines include fan-out line segments with a substantially same extending direction as the data line, an extending direction of the plurality of dummy leads is substantially same as an extending direction of the data line, and an extending direction of the plurality of gate drive signal lines is substantially same as the extending direction of the data line; and orthographic projections of the fan-out line segments on the base substrate and/or orthographic projections of the plurality of dummy leads on the base substrate at least partially overlap with orthographic projections of the plurality of gate drive signal lines on the base substrate.

In some embodiments, in the above display substrate according to the embodiment of the disclosure, the orthographic projections of the fan-out line segments on the base substrate and the orthographic projections of the plurality of dummy leads on the base substrate do not overlap with an orthographic projection of the data line on the base substrate respectively.

In some embodiments, the above display substrate according to the embodiment of the disclosure further includes a plurality of sub-pixels arranged in an array in the special-shaped display area, where every two adjacent columns of sub-pixels form a group, each column of sub-pixels are electrically connected to one data line, two data lines corresponding to each group of sub-pixels are located at a column gap between two columns of sub-pixels in the group; the plurality of gate drive signal lines are arranged in a same layer as the data line, and the gate drive signal lines are located at group gaps arranged at intervals among groups of sub-pixels.

In some embodiments, in the above display substrate according to the embodiment of the disclosure, a shape of the special-shaped display area is a pattern, a letter, a digit or a Chinese character.

In another aspect, an embodiment of the disclosure further provides a display device, including the above display substrate provided by the embodiments of the disclosure.

In another aspect, an embodiment of the disclosure further provides a manufacturing method for the above display substrate, including:

providing a base substrate including a special-shaped display area and a frame area located at least one side of the special-shaped display area; where the special-shaped display area includes a first display area and a second display area located at least one side of the first display area, and the second display area is arranged in contact with the frame area;

forming a data line located in the first display area and the second display area on the base substrate; and forming a plurality of fan-out lines located in the first display area and forming a plurality of dummy leads located in the second display area simultaneously on a layer where the data line is located, where at least one of the plurality of fan-out lines is electrically connected to the data line, and a ratio of a distribution density of the plurality of dummy leads in the second display area to a distribution density of the plurality of fan-out lines in the first display area satisfies a preset threshold.

DETAILED DESCRIPTION OF THE EMBODIMENTS

In order to make the purposes, technical solutions and advantages of the disclosure clearer, the technical solutions of the embodiments of the disclosure will be described clearly and completely below in combination with the accompanying drawings of the embodiments of the disclosure. It is necessary to note that the size and shape of each diagram in the accompanying drawings do not reflect the true proportion, and are merely for purpose of schematically illustrating the content of the disclosure. Also, the same or similar reference numbers represent the same or similar elements or the elements having the same or similar functions all the way.

Unless otherwise defined, the technical or scientific terms used here shall have the general meaning understood by those ordinary skilled in the art to which the disclosure belongs. The "first", "second" and similar words used in the specification and claims of the disclosure do not represent any order, number or importance, and are only used to distinguish different components. The word such as "include" or "contain" or the like means that the element or object appearing before this word encompasses the elements or objects and their equivalents listed after this word, without excluding other elements or objects. The words such as "inner", "outer", "up", "down" are only used to represent the relative position relationship. When the absolute position of a described object changes, the relative position relationship may also change accordingly.

The design and production of special-shaped screens are the top priority of customization needs. The special-shaped screens need to have good uniformity and long life, and also take into account aesthetics, high resolution, etc. The Organic Electro Luminescence (OLED) display screen has the advantages of ultra-thin and integration, the application of the OLED display screen in the special-shaped screen products has gradually gained attention.

Figure 1:
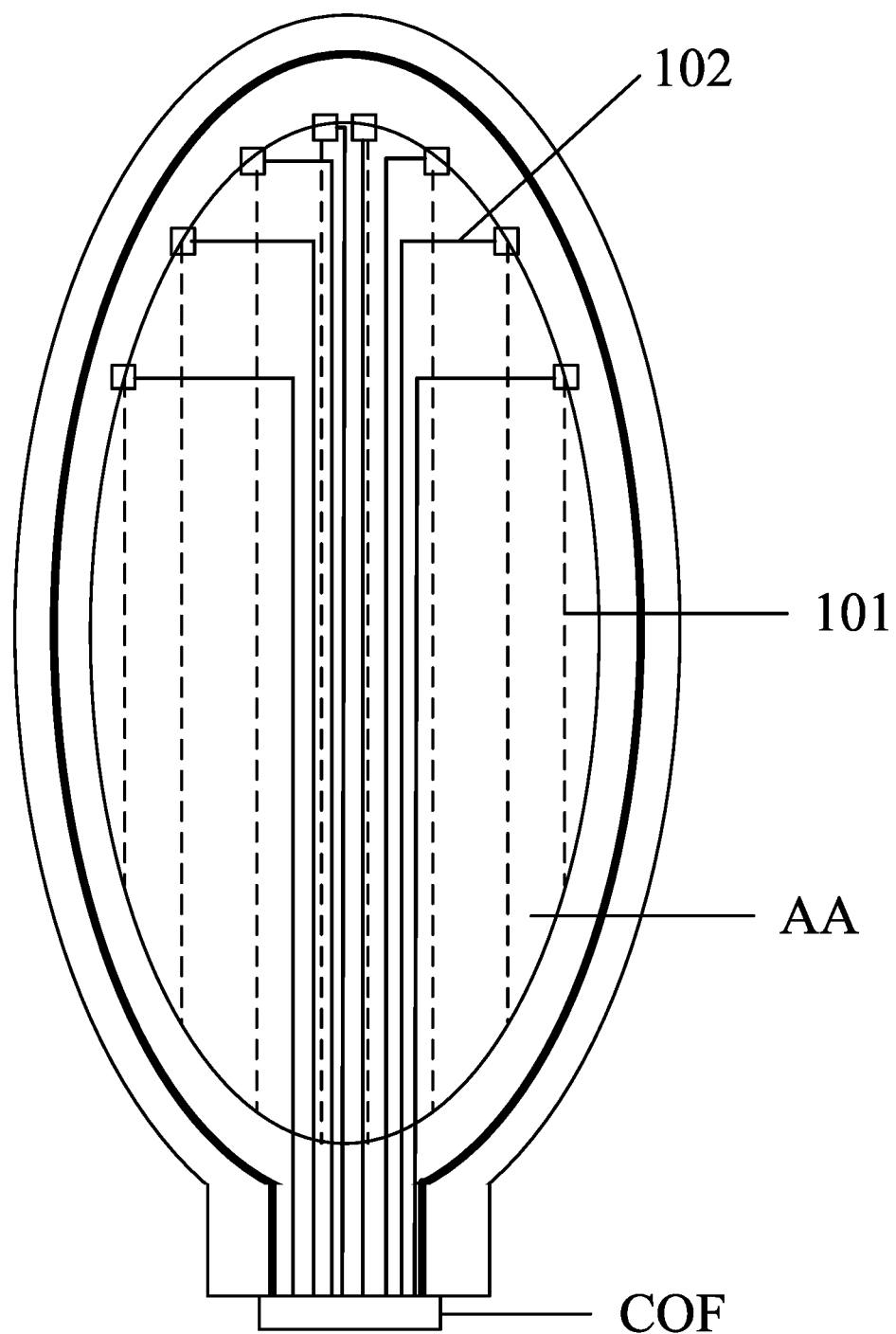
FIG. 1 is a schematic structural diagram of a display substrate in the related art.

The display screens in the related art are generally rectangular screens. The data lines of the rectangular screen can be arranged in the display area (AA), and can be extended vertically and directly connected to the Chip On Film (COF). However, the shape of the special-shaped screen is irregular. If the data lines in the display area are directly extended vertically and the fan-out lines are arranged in the frame area to connect the data lines with the chip on film through the fan-out lines, the frame area will be relatively wide. In order to meet the development trend of narrow border, the fan-out lines may be arranged in the AA area (Fan-out In AA, FIA), specifically as shown in FIG. 1. In the AA area, the data lines 101 located in the first source-drain metal layer ($SD_1$) are connected to the COF through the fan-out lines 102 located in the second source-drain metal layer ($SD_2$). However, it can be seen from FIG. 1 that the distribution of the fan-out lines 102 in the AA area is extremely uneven, which causes the phenomenon of uneven lighting of the special-shaped screen.

Figure 2:
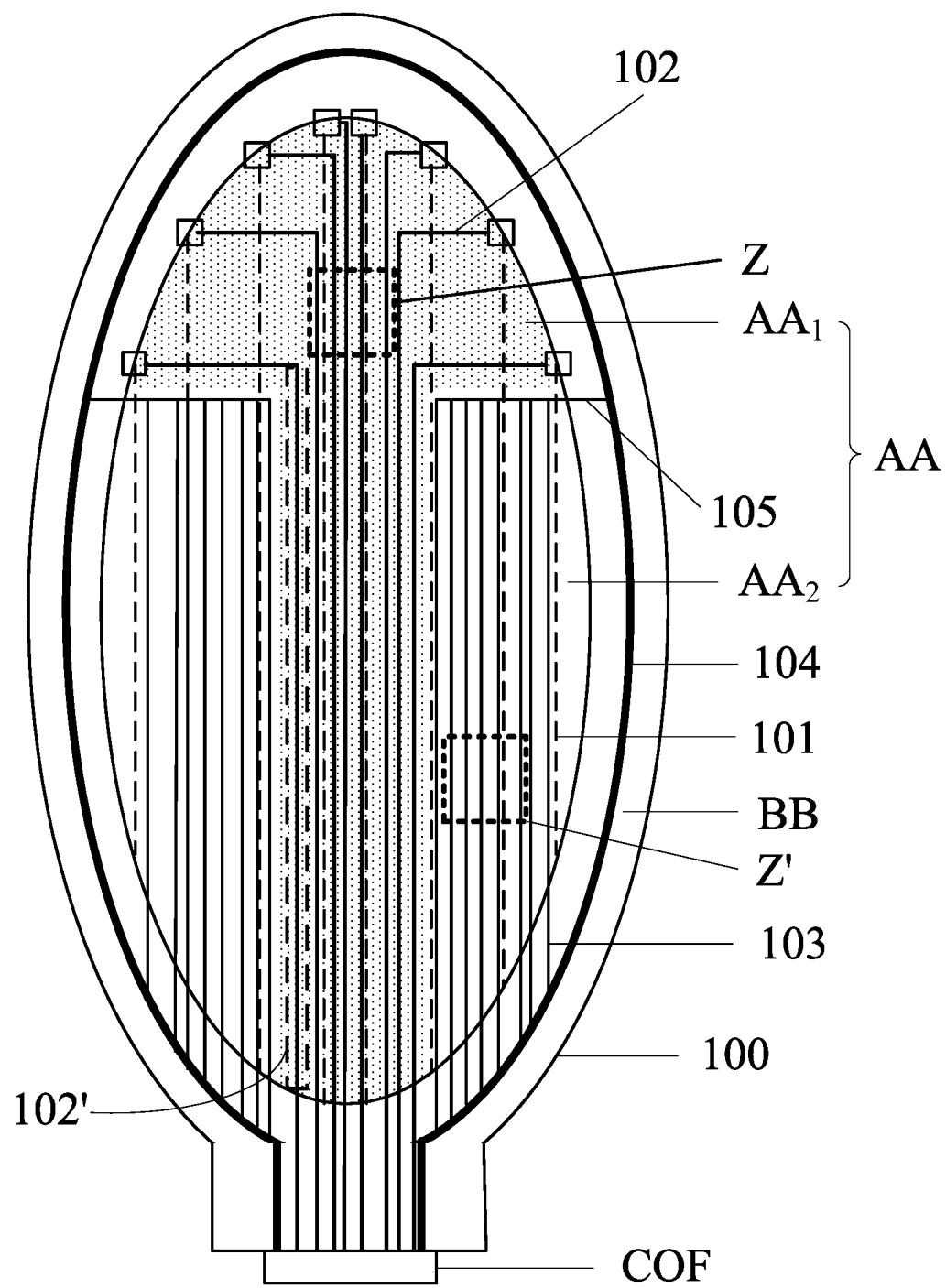
FIG. 2 is a schematic structural diagram of a display substrate according to an embodiment of the disclosure.
Figure 3:
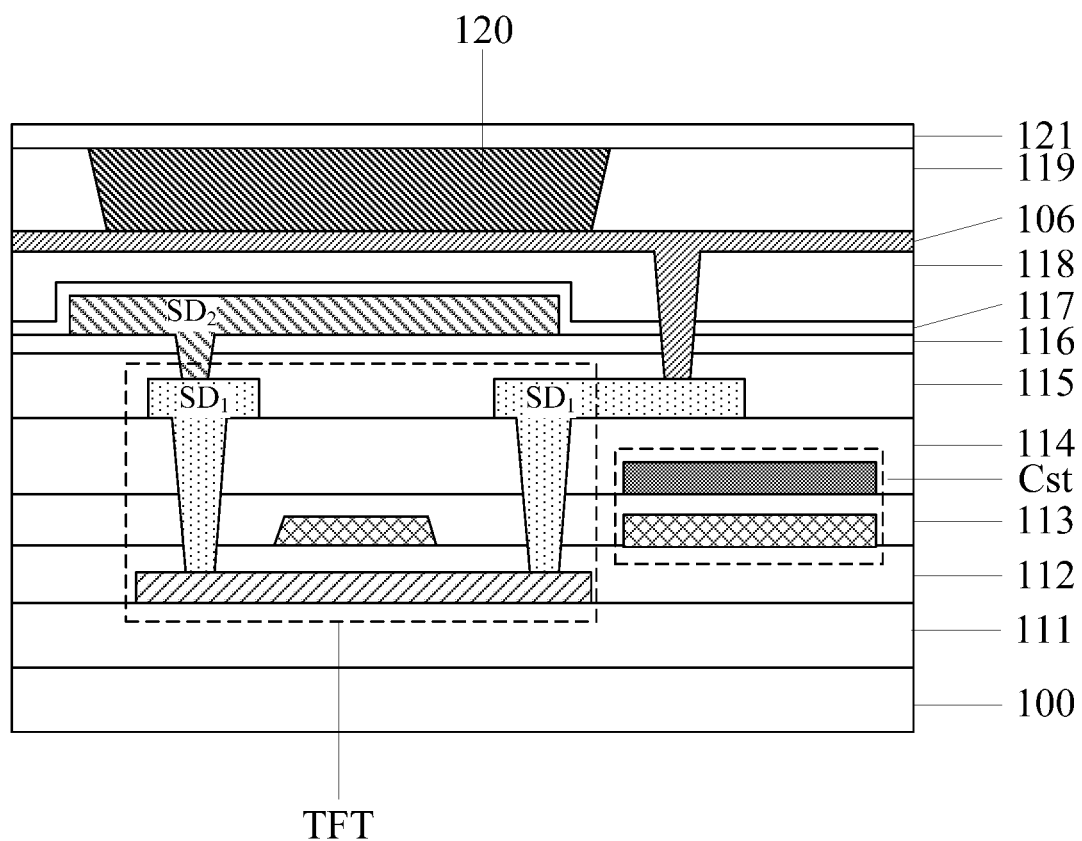
FIG. 3 is a schematic structural diagram of an effective light-emitting area contained in a sub-pixel in the display substrate according to an embodiment of the disclosure.
Figure 4:
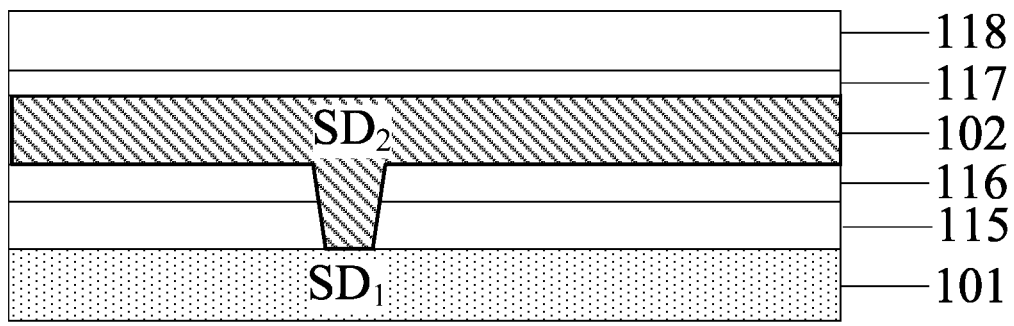
FIG. 4 is a schematic diagram of electrical connections between fan-out lines and data lines in the display substrate according to an embodiment of the disclosure.

In order to improve the above technical problem in the related art, an embodiment of the disclosure provides a display substrate, as shown in FIG. 2 to FIG. 4, including:

- a base substrate 100 including a special-shaped display area AA and a frame area BB located on at least one side of the special-shaped display area AA, where the frame area BB optionally surrounds the special-shaped display area AA; the special-shaped display area AA includes a first display area $AA_1$ and a second display area $AA_2$ located on at least one side of the first display area $AA_1$, and the second display area $AA_2$ is arranged in contact with the frame area BB;
- a data line 101 located on the base substrate 100 and located in the first display area $AA_1$ and the second display area $AA_2$; where there are optionally a plurality of data lines 101 which extend longitudinally;
- a plurality of fan-out lines 102 located on a side of a layer where the data line 101 is located away from the base substrate 100, and located in the first display area $AA_1$, where at least one of the plurality of fan-out lines 102 is electrically connected to the data line 101; where exemplarily the layer where the plurality of data lines 101 are located is a first source-drain metal layer $SD_1$, and the layer where the fan-out lines 102 are located is the second source-drain metal layer $SD_2$; and
- a plurality of dummy leads 103 arranged in a same layer as the plurality of fan-out lines 102 and located in the second display area $AA_2$, where a ratio of a distribution density of the plurality of dummy leads 103 in the second display area $AA_2$ to a distribution density of the plurality of fan-out lines 102 in the first display area $AA_1$ satisfies a preset threshold. For example, the distribution density of the plurality of dummy leads 103 in the second display area $AA_2$ is α, and the distribution density of the plurality of fan-out lines 102 in the first display area $AA_1$ is β, so the ratio of the distribution density of the plurality of dummy leads 103 in the second display area $AA_2$ to the distribution density of the plurality of fan-out lines 102 in the first display area $AA_1$ is α/β.

Figure 5:
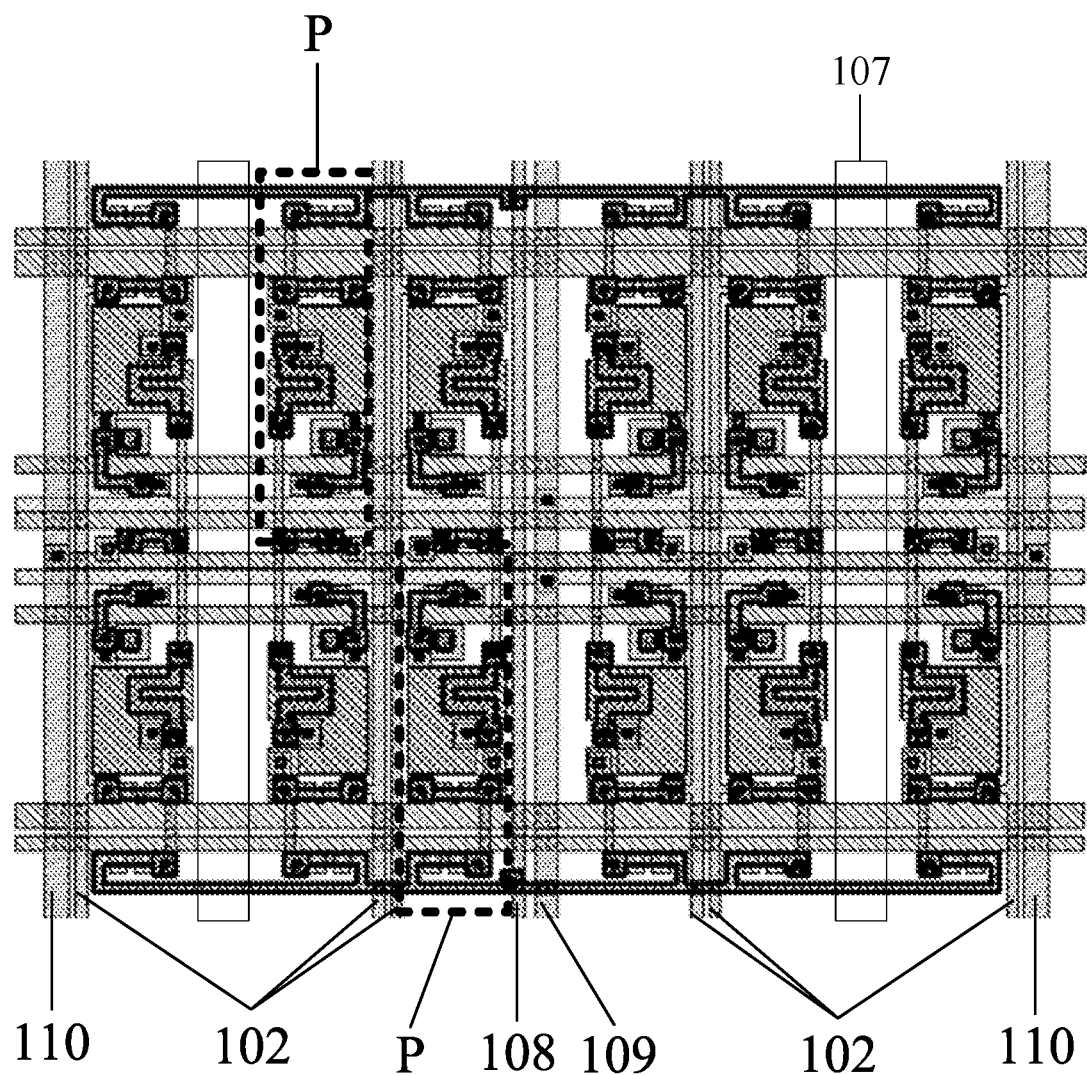
FIG. 5 is a schematic diagram of an enlarged structure of the region Z or region Z' shown in FIG. 2.

It should be noted that the distribution density in the disclosure refers to a ratio of the number of wires in a region with a specific area (e.g., the region of twelve sub-pixels P shown in FIG. 5) to this specific area. The "same layer"

refers to using the same film-forming process to form a film layer for making a specific pattern, and then using the same mask (also called photomask) to form a layer structure through a single mask process. That is, one mask process corresponds to one mask. According to different specific patterns, one mask process may include multiple exposure, development or etching processes, and the specific patterns in the formed layer structure may be continuous or discontinuous. These specific patterns may be at the same height or have the same thickness, or may be at different heights or have different thicknesses.

In the above display substrate according to the embodiment of the disclosure, the dummy leads 103 in the same layer as the fan-out lines 102 (located in the first display area $AA_1$) are arranged in the second display area $AA_2$, and it is ensured that the ratio of the distribution density of the plurality of dummy leads 103 in the second display area $AA_2$ to the distribution density of the plurality of fan-out lines 102 in the first display area $AA_1$ satisfies the preset threshold, so that the whole wiring of the layer where the fan-out lines 102 are located in the special-shaped display area AA is relatively uniform, thereby effectively improving the luminous uniformity.

Figure 6:
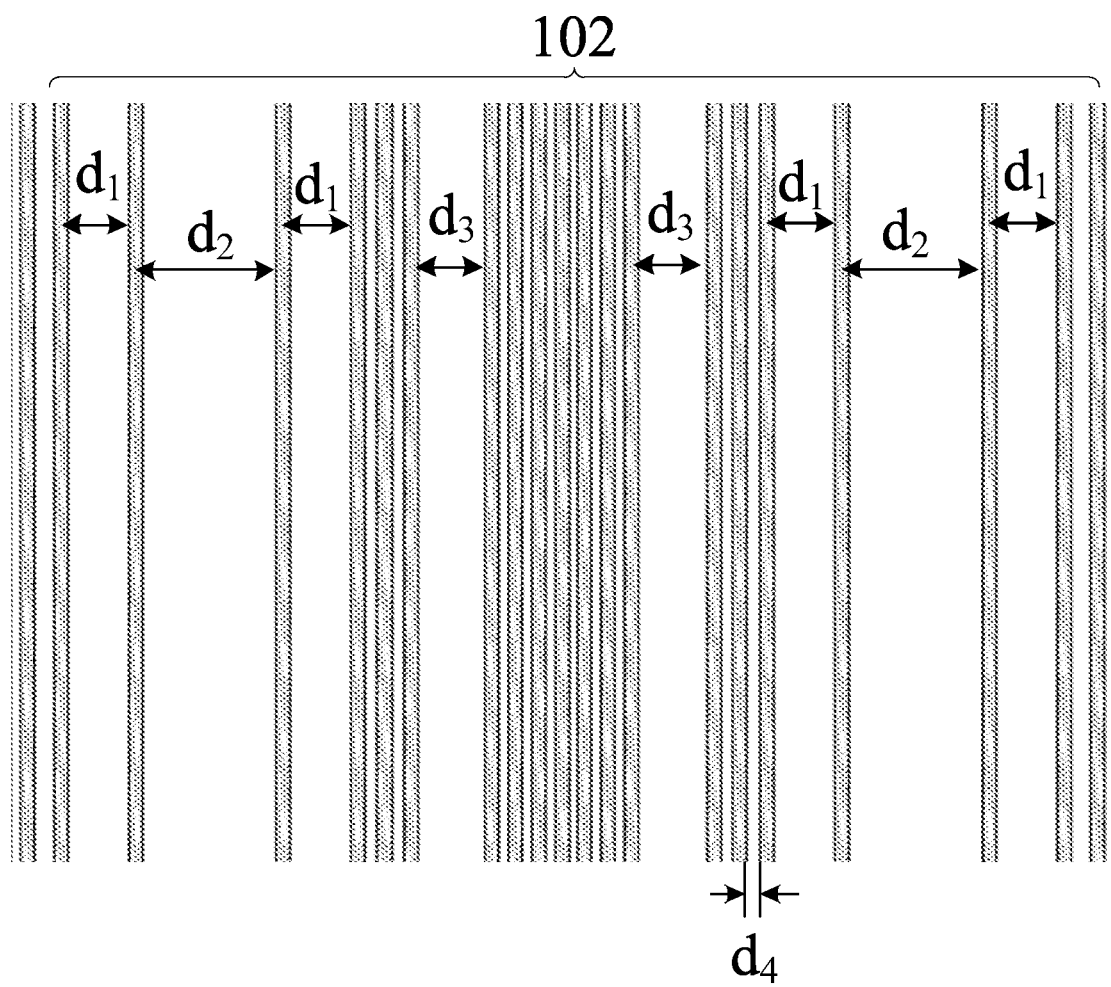
FIG. 6 is a schematic diagram of wiring of fan-out lines in the region Z shown in FIG. 2.
Figure 7:
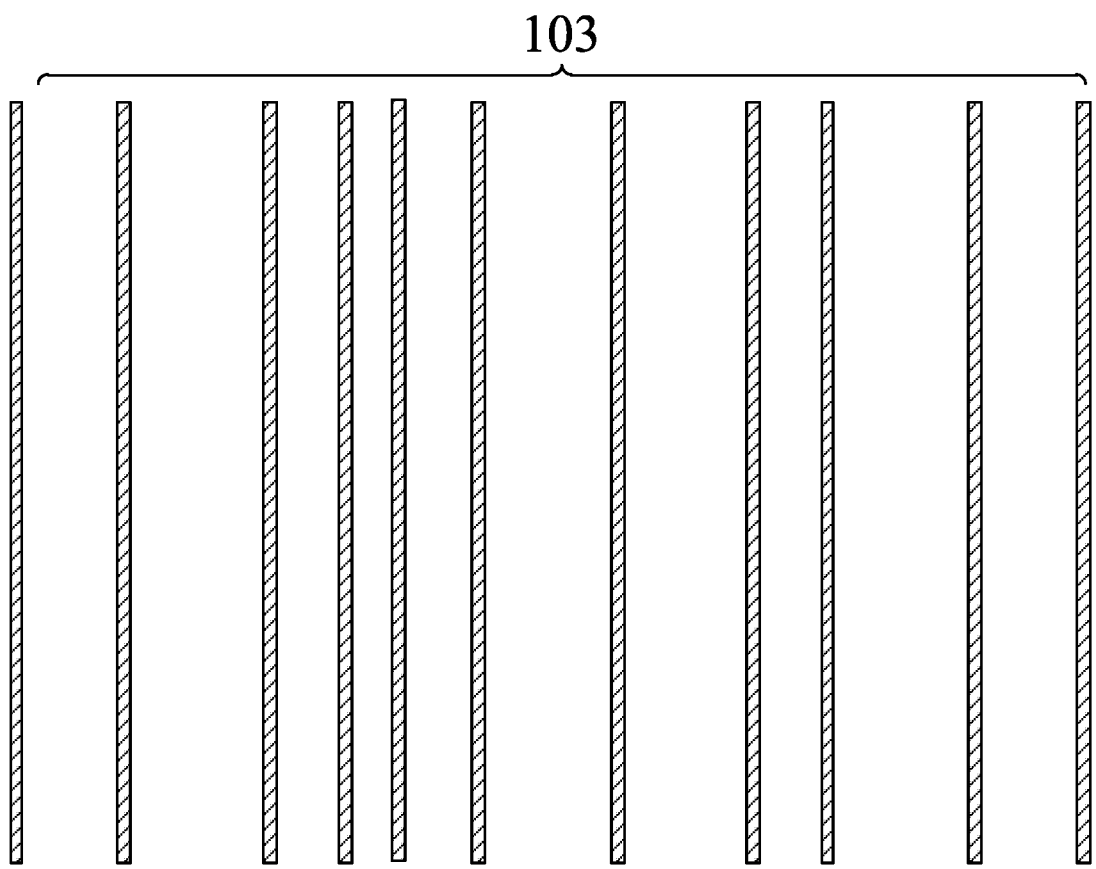
FIG. 7 is a schematic diagram of wiring of dummy leads in the region Z' shown in FIG. 2.
Figure 8:
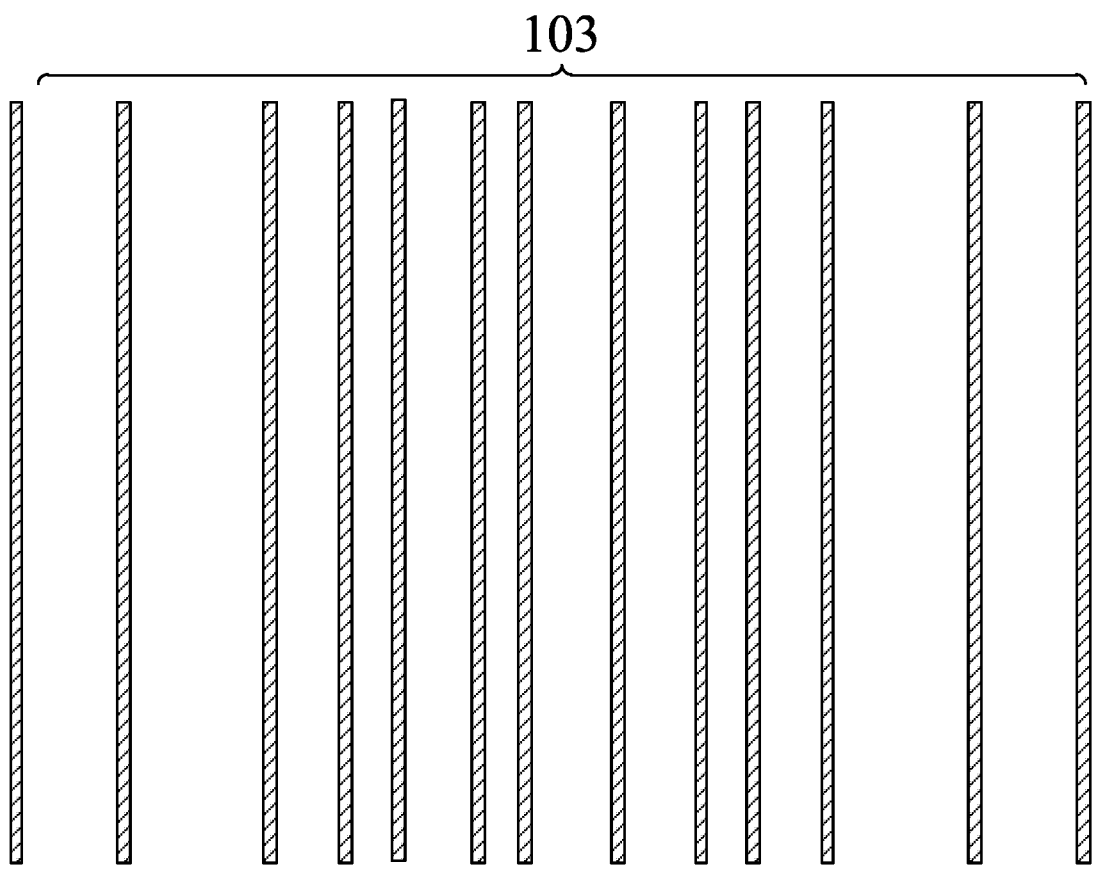
FIG. 8 is another schematic diagram of wiring of dummy leads in the region Z' shown in FIG. 2.
Figure 9:
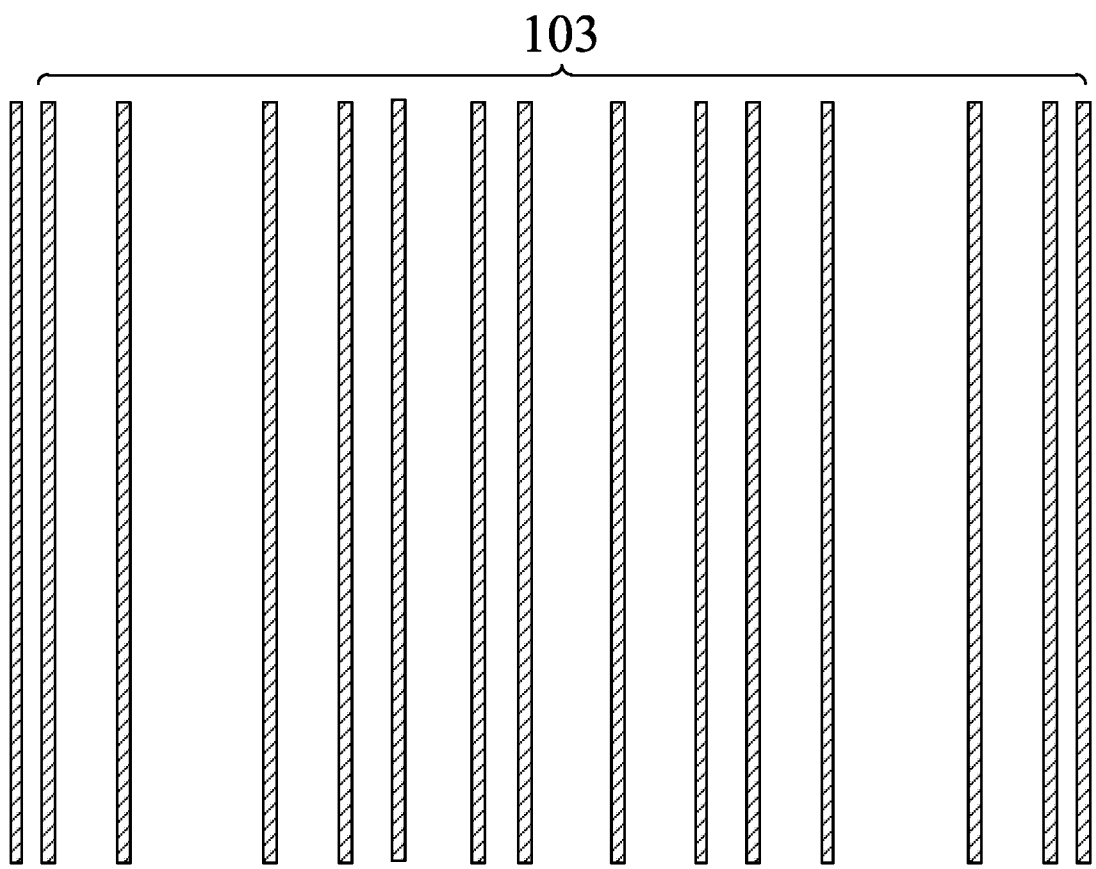
FIG. 9 is another schematic diagram of wiring of dummy leads in the region Z' shown in FIG. 2.
Figure 10:
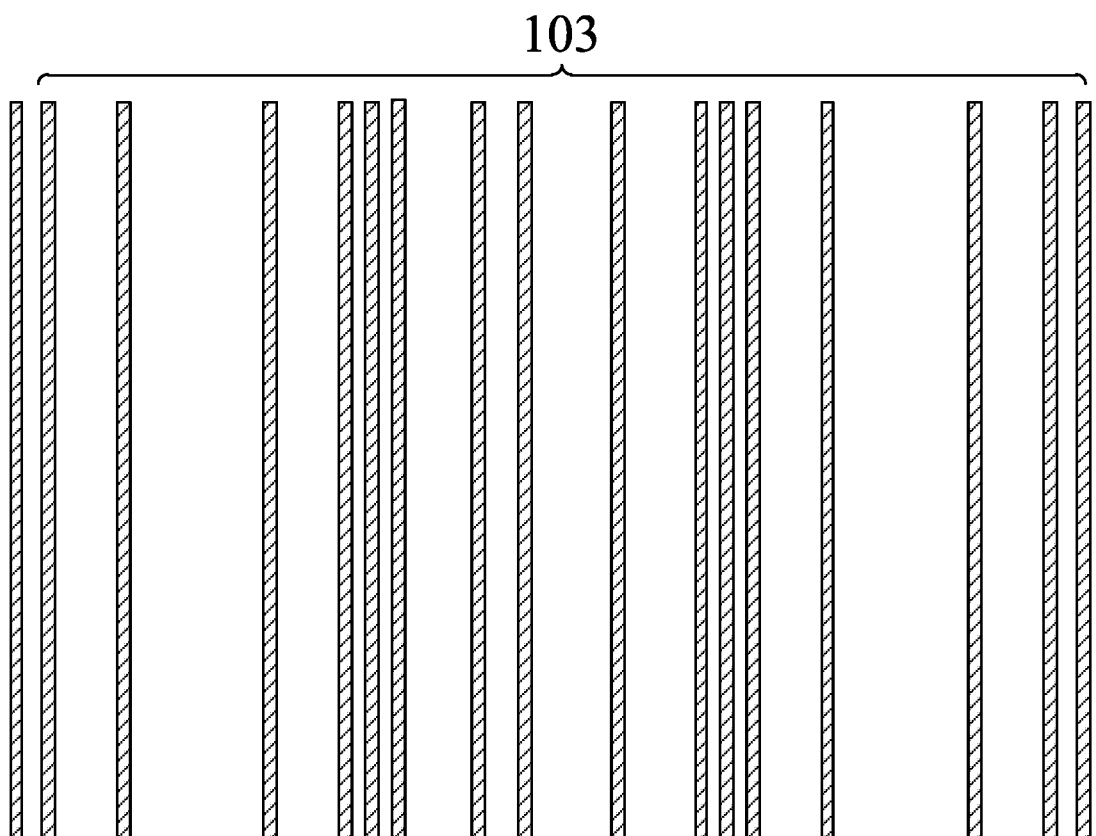
FIG. 10 is another schematic diagram of wiring of dummy leads in the region Z' shown in FIG. 2.
Figure 11:
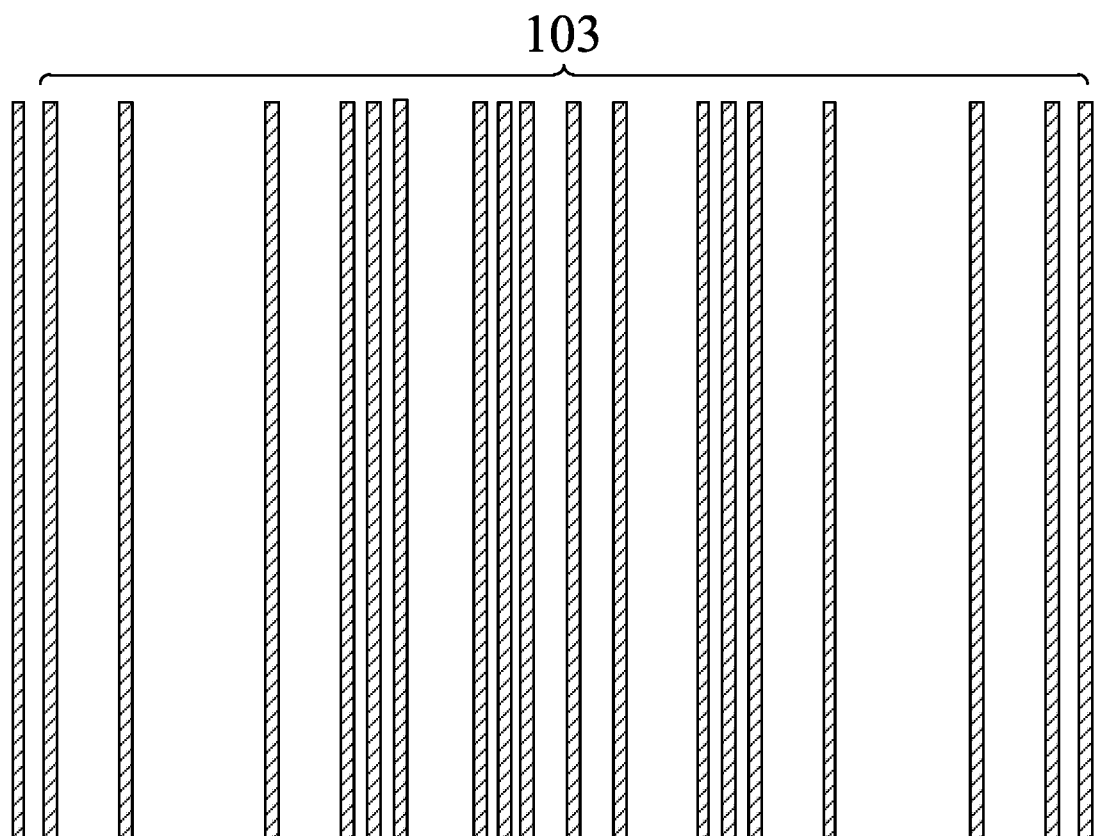
FIG. 11 is another schematic diagram of wiring of dummy leads in the region Z' shown in FIG. 2.
Figure 12:
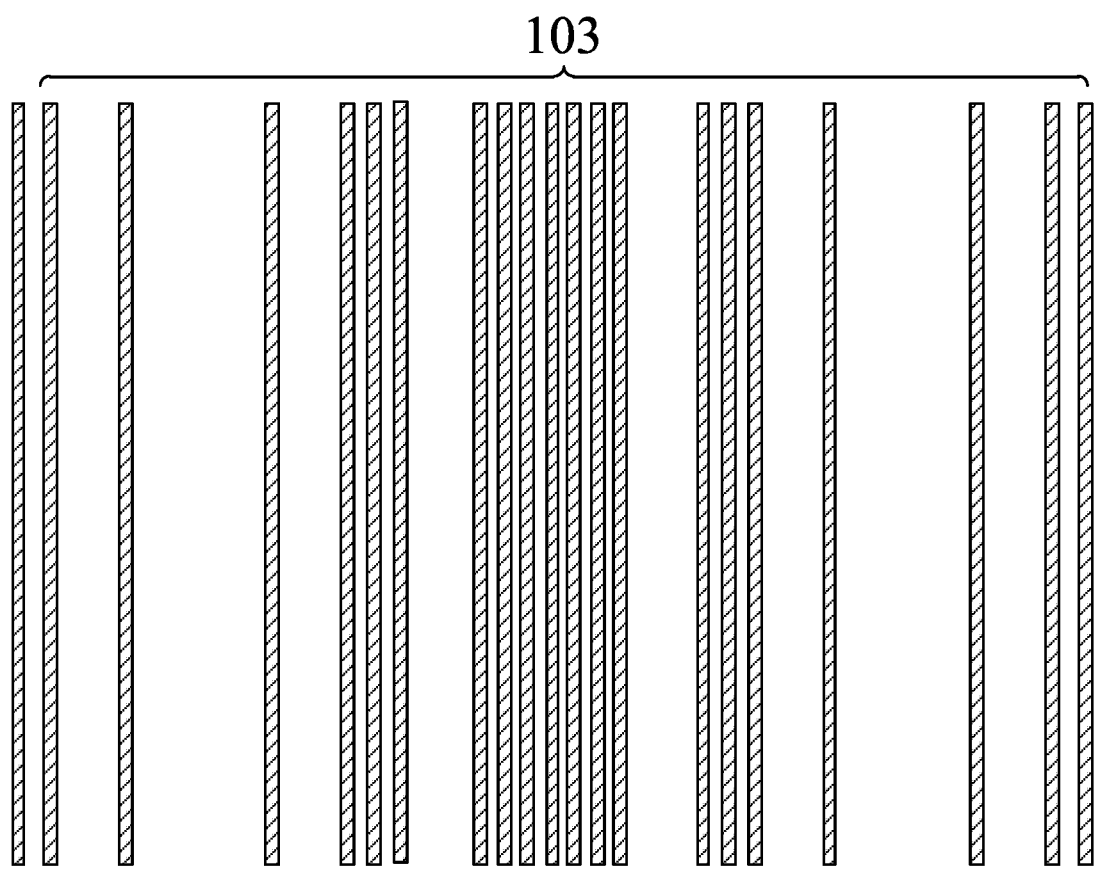
FIG. 12 is another schematic diagram of wiring of dummy leads in the region Z' shown in FIG. 2.
Figure 13:
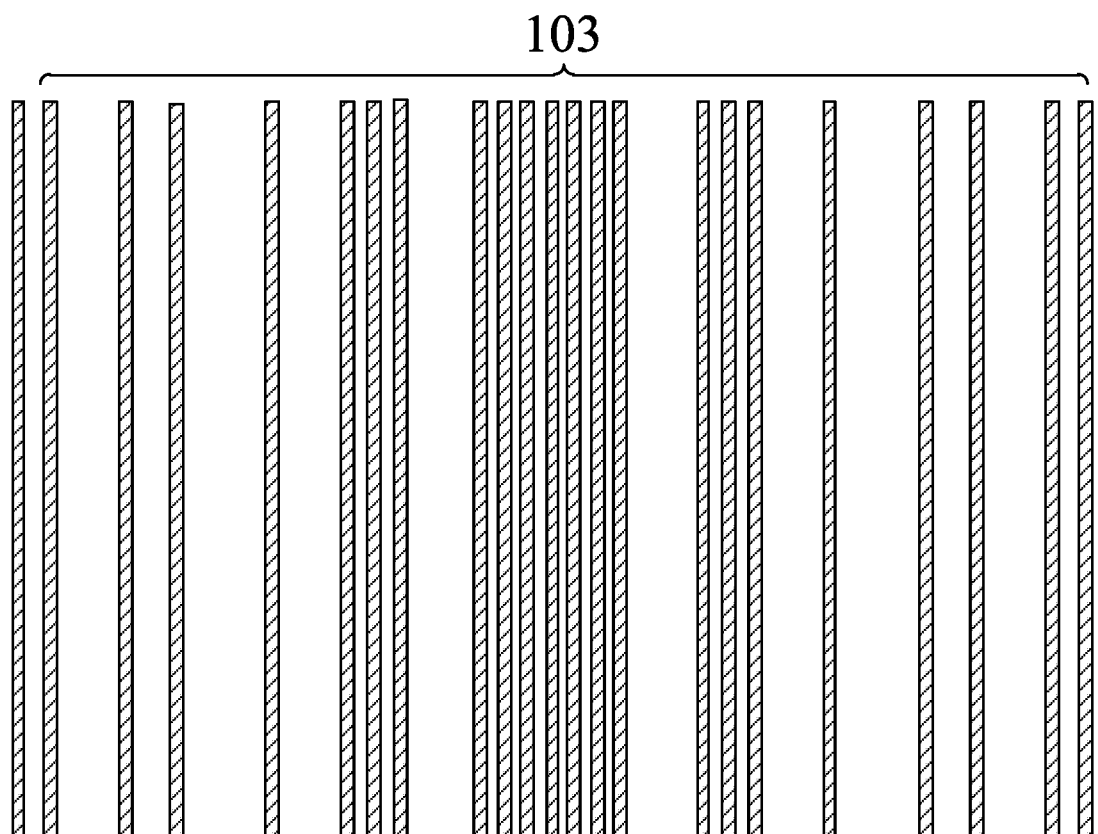
FIG. 13 is another schematic diagram of wiring of dummy leads in the region Z' shown in FIG. 2.
Figure 14:
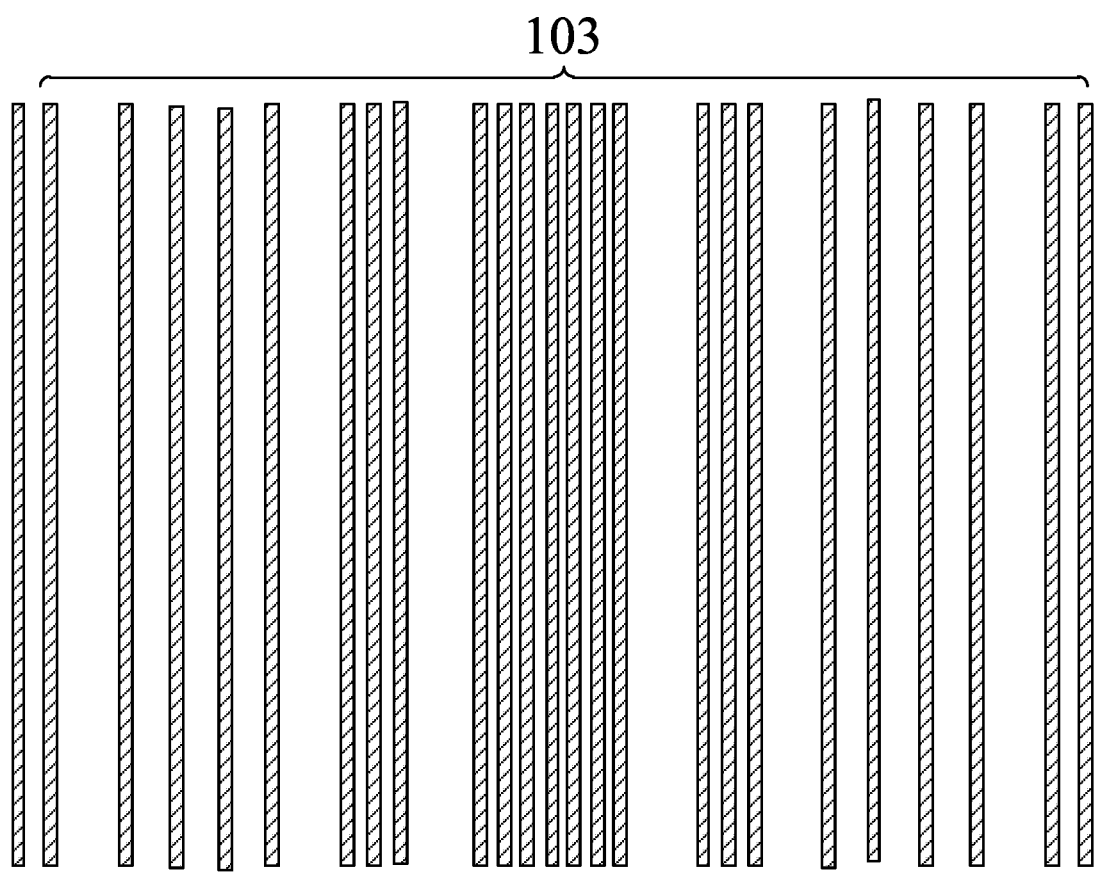
FIG. 14 is another schematic diagram of wiring of dummy leads in the region Z' shown in FIG. 2.
Figure 15:
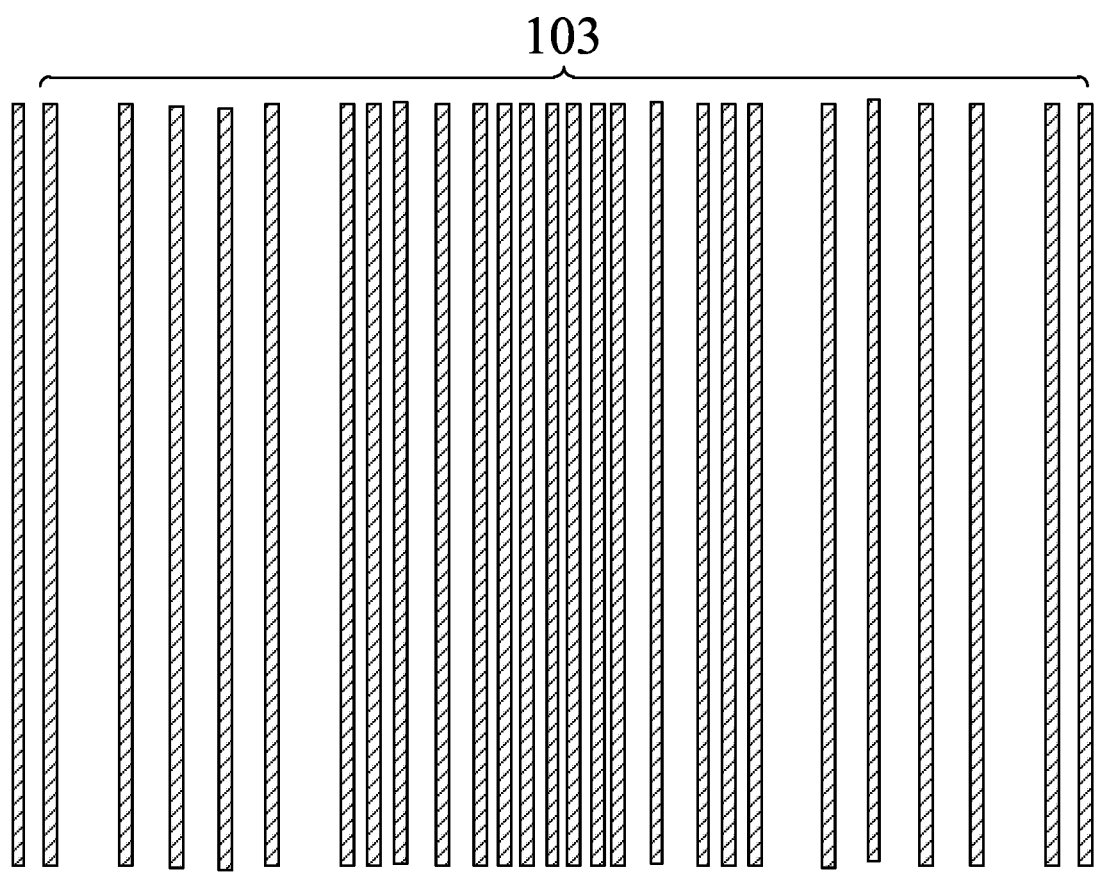
FIG. 15 is another schematic diagram of wiring of dummy leads in the region Z' shown in FIG. 2.
Figure 16:
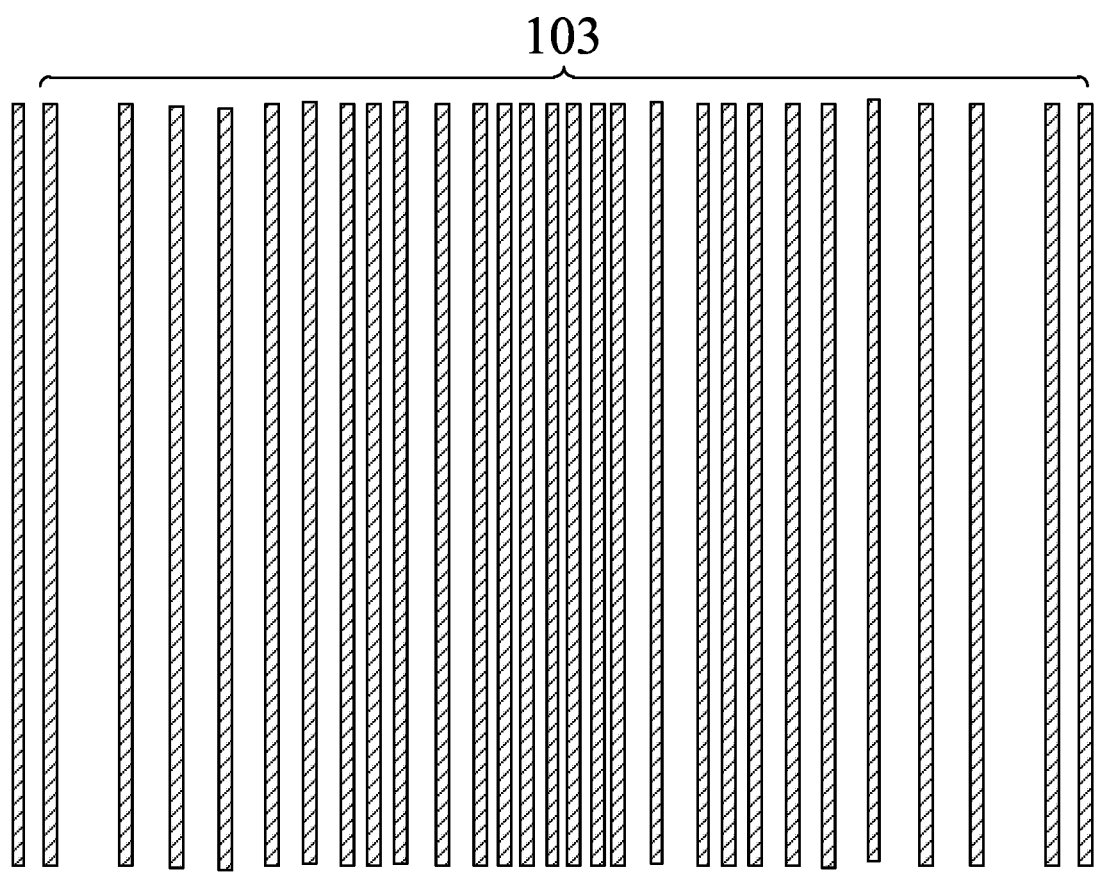
FIG. 16 is another schematic diagram of wiring of dummy leads in the region Z' shown in FIG. 2.
Figure 17:
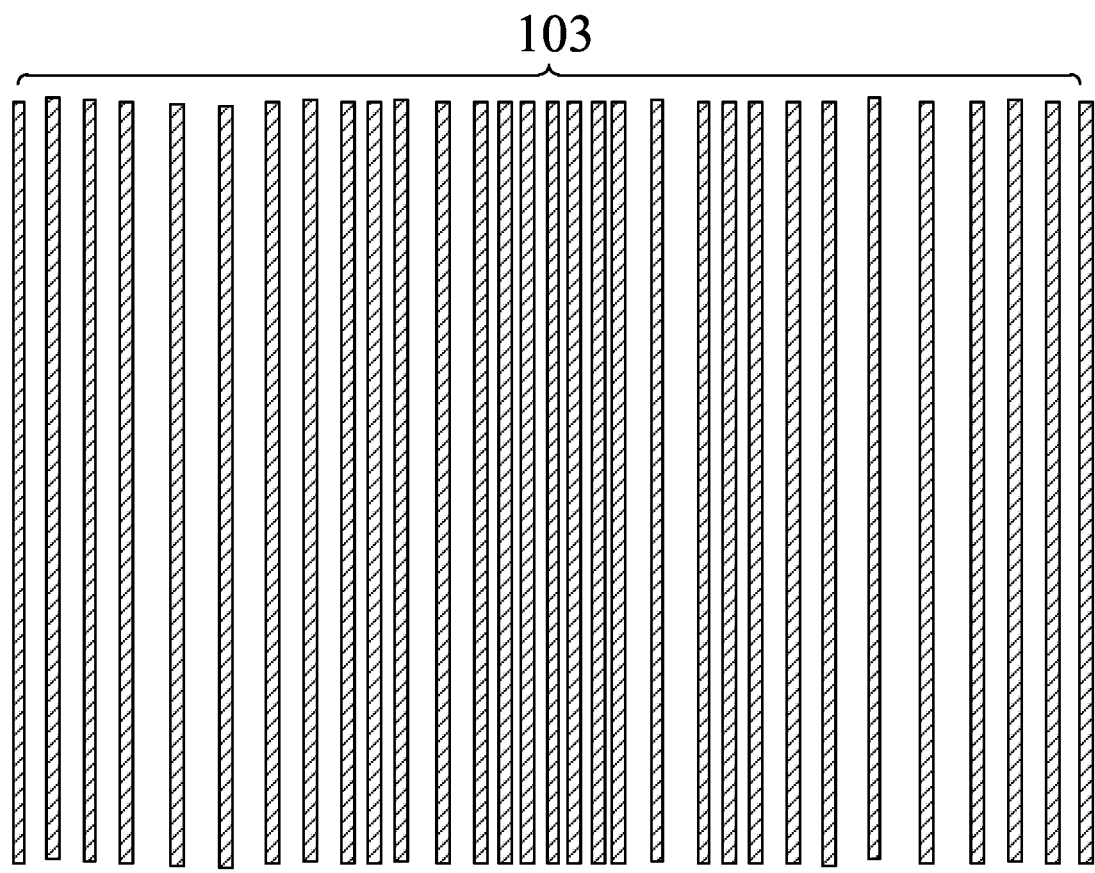
FIG. 17 is another schematic diagram of wiring of dummy leads in the region Z' shown in FIG. 2.

In some embodiments, in the above display substrate according to the embodiment of the disclosure, the preset threshold may be greater than or equal to 0.5 and less than or equal to 1.5. Optionally, FIG. 6 shows a wiring density of fan-out lines 102 in the region of twelve sub-pixels P shown in FIG. 5. As can be seen from FIG. 6, the wiring number of fan-out lines 102 within the region of twelve sub-pixels P is 21. FIG. 7 to FIG. 17 respectively show wiring densities of dummy leads 103 in the region of twelve sub-pixels P shown in FIG. 5 when the preset threshold are successively 0.5, 0.6, 0.7, 0.8, 0.9, 1, 1.1, 1.2, 1.3, 1.4 and 1.5, compared with the wiring density of fan-out lines 102 shown in FIG. 6. It should be understood that the dummy leads 103 take strip as a unit, so in a case that when the number of dummy leads 103 calculated according to the wiring density of fan-out lines 102 shown in FIG. 6 and each above preset threshold has a decimal place, and the number of dummy leads 103 is not less than the theoretical number (10.5) of dummy leads 103 corresponding to the preset threshold of 0.5 and not greater than the theoretical number (31.5) of dummy leads 103 corresponding to the preset threshold of 1.5, the actual number of dummy leads 103 can be rounded off. Exemplarily, FIG. 7 shows that there are 11 dummy leads 103 in the region of twelve sub-pixels P, FIG. 8 shows that there are 13 dummy leads 103 in the region of twelve sub-pixels P, FIG. 9 shows that there are 15 dummy leads 103 in the region of twelve sub-pixels P, FIG. 10 shows that there are 17 dummy leads 103 in the region of twelve sub-pixels P, FIG. 11 shows that there are 19 dummy leads 103 in the region of twelve sub-pixels P, FIG. 12 shows that there are 21 dummy leads 103 in the region of twelve sub-pixels P, FIG. 13 shows that there are 23 dummy leads 103 in the region of twelve sub-pixels P, FIG. 14 shows that there are 25 dummy leads 103 in the region of twelve sub-pixels P, FIG. 15 shows that there are 27 dummy leads 103 in the region of twelve sub-pixels P, FIG. 16 shows that there are 29 dummy leads 103 in the region of twelve sub-pixels P, and FIG. 17 shows that there are 31 dummy leads 103 in the region of twelve sub-pixels P. In the disclosure, when the preset threshold is greater than or equal to 0.8 and less than or equal to 1.2, the distribution uniformity of the fan-out lines 102 and dummy leads 103 arranged in the same layer is better, which can effectively improve the luminous uniformity; when the preset threshold is 1, the distribution uniformity of the fan-out lines 102 and dummy leads 103 is the best, which can maximally improve the luminous uniformity.

In some embodiments, the above display substrate according to the embodiment of the disclosure, as shown in FIG. 2, may further include: a first power line 104 (for example, a low level power line VSS) located in the frame area BB. Optionally, the first power line 104 surrounds the special-shaped display area AA and is electrically connected to the plurality of dummy leads 103, to ensure the stable potential on the dummy leads 103 and avoid the potential fluctuation on the dummy leads 103 to affect the display effect. Optionally, as shown in FIG. 2, the first power line 104 and the plurality of dummy leads 103 form a closed loop, so as to maintain the overall potential stability of all dummy leads 103 and avoid the potential fluctuation in the second display area $AA_2$ to affect the display effect. In some embodiments, as shown in FIG. 2, a connection line 105 in the same layer as the plurality of dummy leads 103 may also be arranged, so that the dummy leads 103 form a closed loop with the first power line 104 through the connection line 105. Optionally, each dummy lead 103 extends longitudinally, and the connection line 105 extends laterally.

Figure 18:
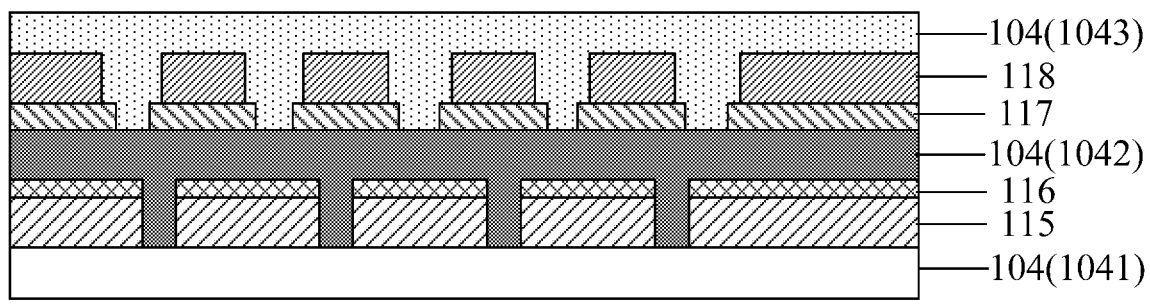
FIG. 18 is a schematic diagram of a cross-sectional structure of a first power line according to an embodiment of the disclosure.
Figure 19:
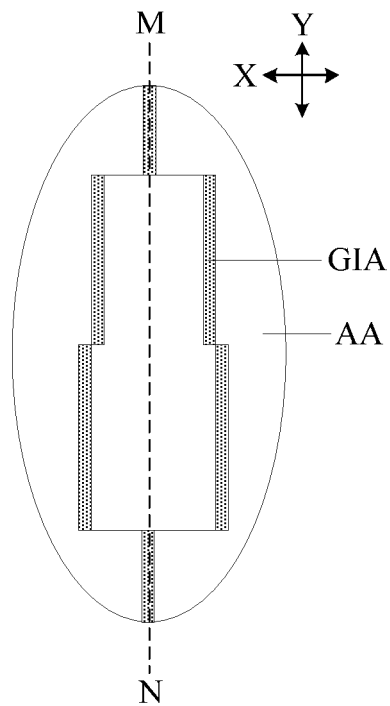
FIG. 19 is a schematic diagram of an area where the gate drive circuit is located according to an embodiment of the disclosure.
Figure 20:
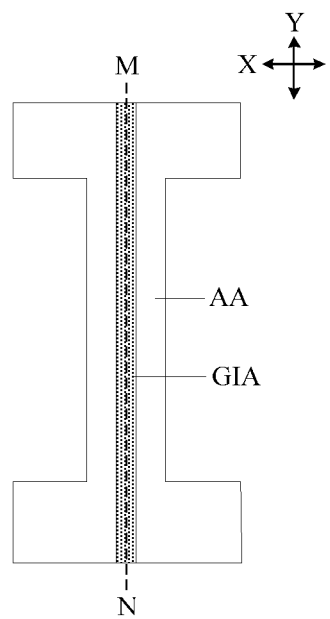
FIG. 20 is another schematic diagram of an area where the gate drive circuit is located according to an embodiment of the disclosure.
Figure 21:
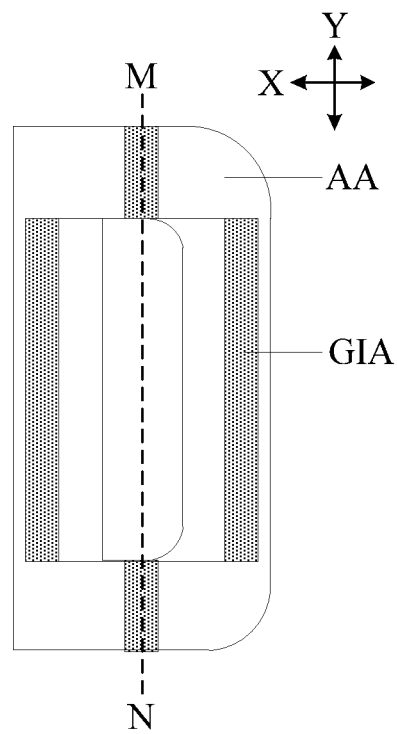
FIG. 21 is another schematic diagram of an area where the gate drive circuit is located according to an embodiment of the disclosure.
Figure 22:
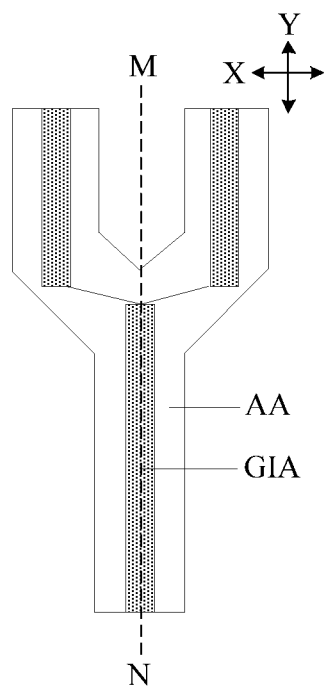
FIG. 22 is another schematic diagram of an area where the gate drive circuit is located according to an embodiment of the disclosure.
Figure 23:
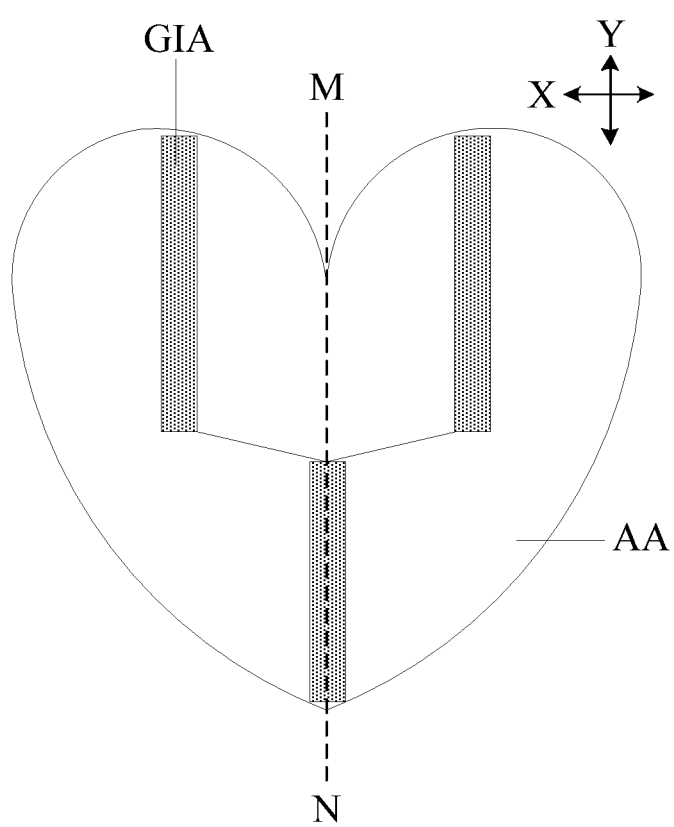
FIG. 23 is another schematic diagram of an area where the gate drive circuit is located according to an embodiment of the disclosure.

In some embodiments, in the above display substrate according to the embodiment of the disclosure, as shown in FIG. 2 and FIG. 18, the first power line 104 may located at least in the layer where the plurality of dummy leads 103 are located, and the first power line 104 is integral with the plurality of dummy leads 103, so that the patterns of the dummy leads 103 and the first power line 104 in this layer can be fabricated by one mask process to avoid adding the mask process of the dummy leads 103 separately. Furthermore, the integration of the first power line 104 with the plurality of dummy leads 103 can also effectively reduce the resistance of the first power line 104 and help to maintain the consistency of signals transmitted on the first power line 104. Optionally, as shown in FIG. 18, in order to further reduce the resistance of the first power line 104, the first power line 104 may include a first sub-power line 1041 in the layer where the data line 101 is located, a second sub-power line 1042 in the layer where the dummy leads 103 are located, and a third sub-power line 1043 in the layer where the anode 106 is located. The first sub-power line 1041, the second sub-power line 1042 and the third sub-power line 1043 are stacked and connected through via holes.

In some embodiments, in the above display substrate according to the embodiment of the disclosure, as shown in FIG. 19 to FIG. 23, a gate drive circuit GIA may further be arranged in the special-shaped display area AA, so that it is unnecessary to arrange the gate drive circuit GIA in the frame area BB, so as to realize the narrow frame design. The gate drive circuit GIA is used to provide drive signals to gate lines.

In some embodiments, in the above display substrate according to the embodiment of the disclosure, the gate drive circuit GIA includes a plurality of shift registers arranged in cascade, and these shift registers may be symmetrically arranged about a center axis MN of the special-shaped display area AA in a column direction Y, as shown in FIG. 19 to FIG. 23. In this way, the gate drive circuit GIA can synchronously provide driving signals for the sub-pixels P in the same row on both sides of the center axis MN through the gate line, improving the display effect. Optionally, in order to facilitate the electrical connection between the gate drive circuit GIA and the gate line, the plurality of shift registers included in the gate drive circuit GIA may be arranged in cascade at row gaps of rows of sub-pixels P along the column direction Y.

Figure 24:
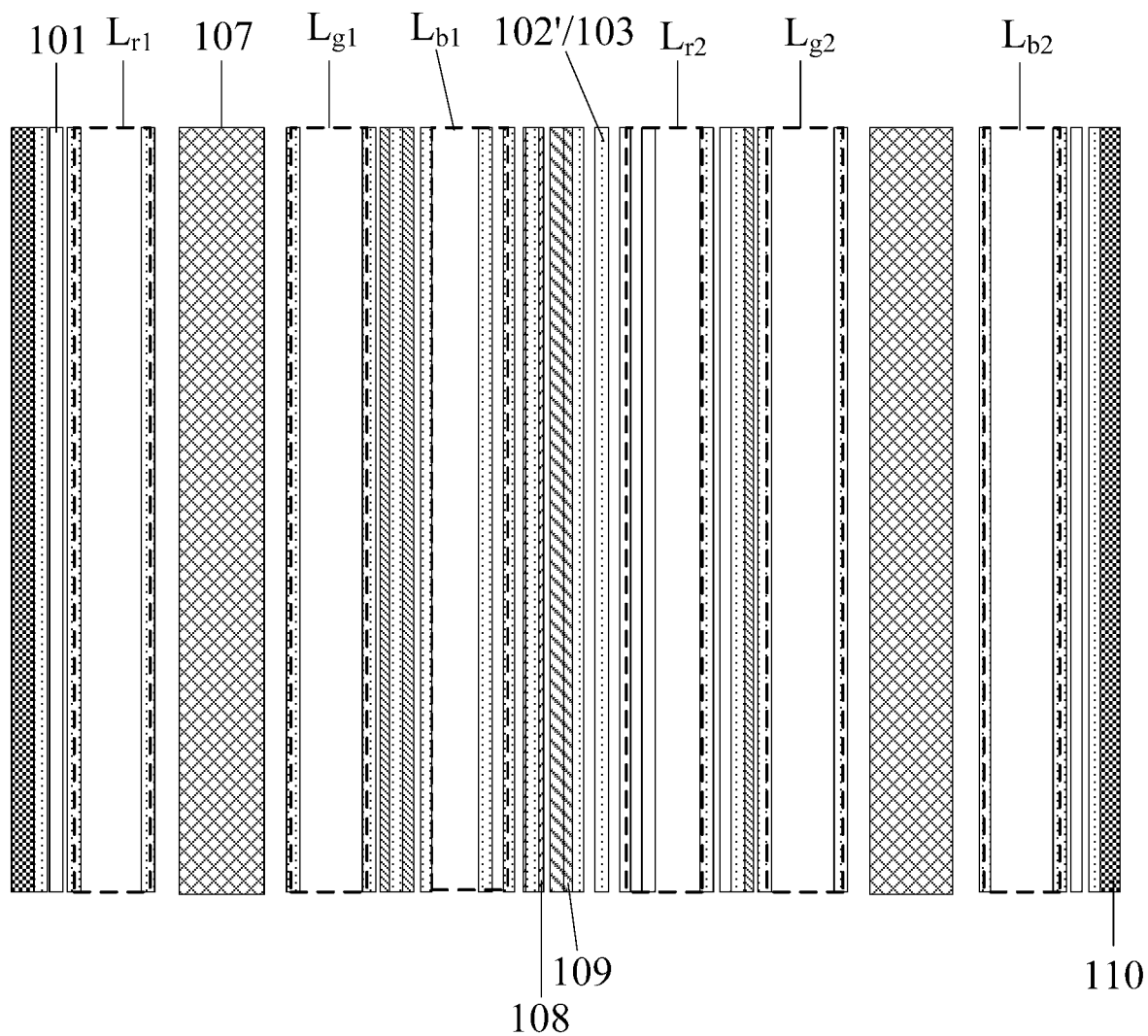
FIG. 24 is a schematic diagram of wiring of different signal lines in the region Z or region Z' shown in FIG. 2.

In some embodiments, the above display substrate according to the embodiment of the disclosure, as shown in FIG. 2 and FIG. 24, may further include a plurality of gate drive signal lines 107 which provide control signals to the gate drive circuit GIA and are all located in the first display area $AA_1$ and the second display area $AA_2$, so that it is unnecessary to arrange the gate drive signal lines 107 in the frame area BB, so as to realize the narrow frame design. Optionally, the plurality of gate drive signal lines 107 may be clock signal lines (Clk), frame start signal lines (STV), etc.

In some embodiments, in the above display substrate according to the embodiment of the disclosure, as shown in FIG. 2 and FIG. 24, the plurality of fan-out lines 102 may include fan-out line segments 102' with a substantially same extending direction as the data line 101, an extending direction of the dummy leads 103 is substantially same as an extending direction of the data line 101, and an extending direction of the gate drive signal lines 107 is substantially same as the extending direction of the data line 101. Optionally, the orthographic projections of the fan-out line segments 102' on the base substrate 100 and/or the orthographic projections of the plurality of dummy leads 103 on the base substrate 100 do not overlap with the orthographic projections of the plurality of gate drive signal lines 107 on the base substrate 100, to avoid the formation of coupling capacitances between the fan-out line segments 102' and/or dummy leads 103 and the gate drive signal lines 107.

It should be noted that, in the embodiments provided by the disclosure, due to limitations of process conditions or other factors such as measurement, the relationship of "substantially same extending direction" between the above features may be exactly parallel extending directions, or there may be some deviation (for example, the acute angle of intersection of extending directions is less than or equal to 5°). Therefore, the relationship of "substantially same extending direction" between the above features belongs to the protection scope of the disclosure as long as the relationship satisfies the tolerance of error.

In some embodiments, in the above display substrate according to the embodiment of the disclosure, as shown in FIG. 24, each column of sub-pixels (such as $L_{r1}$, $L_{g1}$, $L_{b1}$, $L_{r2}$, $L_{g2}$, $L_{b2}$) includes an edge area adjacent to the column gap; in the case that the orthographic projections of the fan-out line segments 102' and the dummy leads 103 on the base substrate 100 do not overlap with the orthographic projections of the gate drive signal lines 107 on the base substrate 100, the gate drive signal lines 107 can be arranged at some column gaps of columns of sub-pixels; in the first display area $AA_1$, the orthographic projections of the fan-out line segments 102' on the base substrate 100 at least partially overlap with the orthographic projections of the edge areas of columns of sub-pixels on the base substrate 100, and the orthographic projections of the fan-out line segments 102' on the base substrate 100 at least partially overlap with the orthographic projections of the column gaps provided with no gate drive signal lines 107 on the base substrate 100; in the display area $AA_2$, the orthographic projections of the plurality of dummy leads 103 on the base substrate 100 at least partially overlap with the orthographic projections of the edge areas of columns of sub-pixels on the base substrate 100, and the orthographic projections of the plurality of dummy leads 103 on the base substrate 100 at least partially overlap with the orthographic projections of the column gaps provided with no gate drive signal lines 107 on the base substrate 100. In this way, the effect that the orthographic projections of the fan-out line segments 102' and the plurality of dummy leads 103 on the substrate 100 do not overlap with the orthographic projections of the plurality of gate drive signal lines 107 on the substrate 100 can be achieved; and at the same time, it is ensured that the distribution densities and wiring methods of the fan-out lines 102 in a region with a specific area (for example, the region where twelve sub-pixels P in two rows and six columns are located) are the same, so as to maximally improve the luminous uniformity.

It should be noted that the wiring method of the fan-out line segments 102' in FIG. 24 is the same as the wiring method of the fan-out lines 102 in FIG. 6. In order to avoid short-circuiting of two adjacent fan-out lines 102, a distance between two adjacent fan-out lines 102 can be set to be greater than or equal to 2.7 μm; for example, in FIG. 6, $d_1$ is 17.6 μm, $d_2$ is 38 μm, and $d_3$ is 19.5 μm. $d_4$ is 2.7 μm. Optionally, a line width of each fan-out line 102 may be greater than or equal to 2.5 μm and less than or equal to 2.6 μm, for example, the line width of the fan-out line 102 is 2.54 μm, 2.56 μm, etc.

Figure 25:
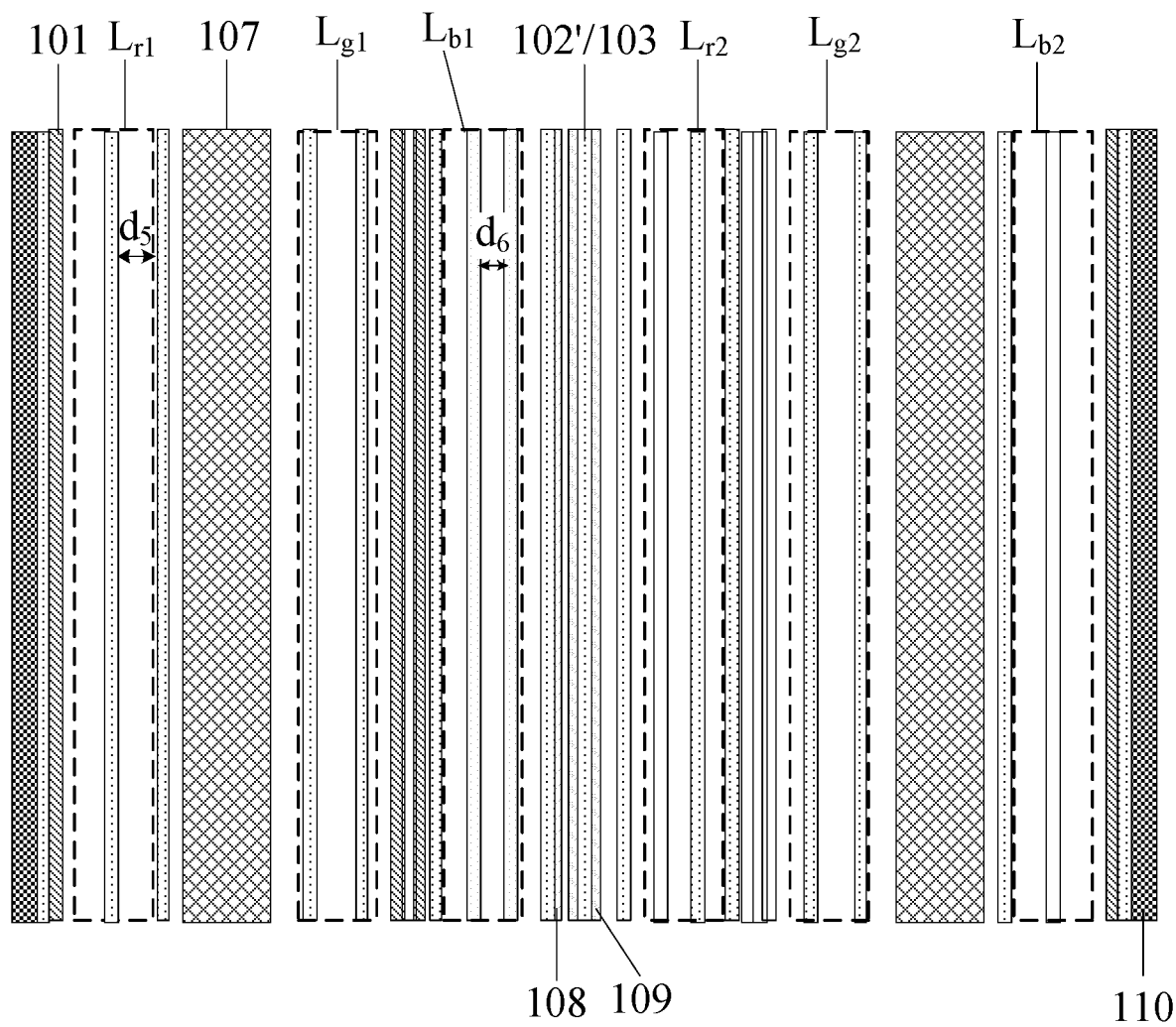
FIG. 25 is another schematic diagram of wiring of different signal lines in the region Z or region Z' shown in FIG. 2.

In some embodiments, in the above display substrate according to the embodiment of the disclosure, when the orthographic projections of the fan-out line segments 102' and the dummy leads 103 on the base substrate 100 do not overlap with the orthographic projections of the gate drive signal lines 107 on the base substrate 100, as shown in FIG. 25, the orthographic projections of the fan-out line segments 102' on the base substrate 100 are substantially evenly distributed among the orthographic projections of the gate drive signal lines 107 on the base substrate 100 in the first display area $AA_1$; and the orthographic projections of the dummy leads 103 on the base substrate 100 are substantially evenly distributed among the orthographic projections of the gate drive signal lines 107 on the base substrate 100 in the second display area $AA_2$. In this way, the effect that the orthographic projections of the fan-out line segments 102' and the plurality of dummy leads 103 on the substrate 100 do not overlap with the orthographic projections of the plurality of gate drive signal lines 107 on the substrate 100 can also be achieved; and at the same time, it is ensured that the distribution densities and wiring methods of the fan-out lines 102 in a region with a specific area (for example, the region where twelve sub-pixels P in any two rows and six columns are located) are the same, so as to maximally improve the luminous uniformity.

It should be noted that "substantially evenly distributed" in the disclosure means that in an area between the gate drive signal lines 107, a distance between any two adjacent fan-out lines 102 or any adjacent dummy leads 103 is equal or a distance difference is in the range of 40%. For example, in FIG. 25, $d_5$ is 11 μm, $d_6$ is 6.75 μm, and $(d_5-d_6)/d_5$ is approximately equal to 39%, within the range of 40%.

Figure 26:
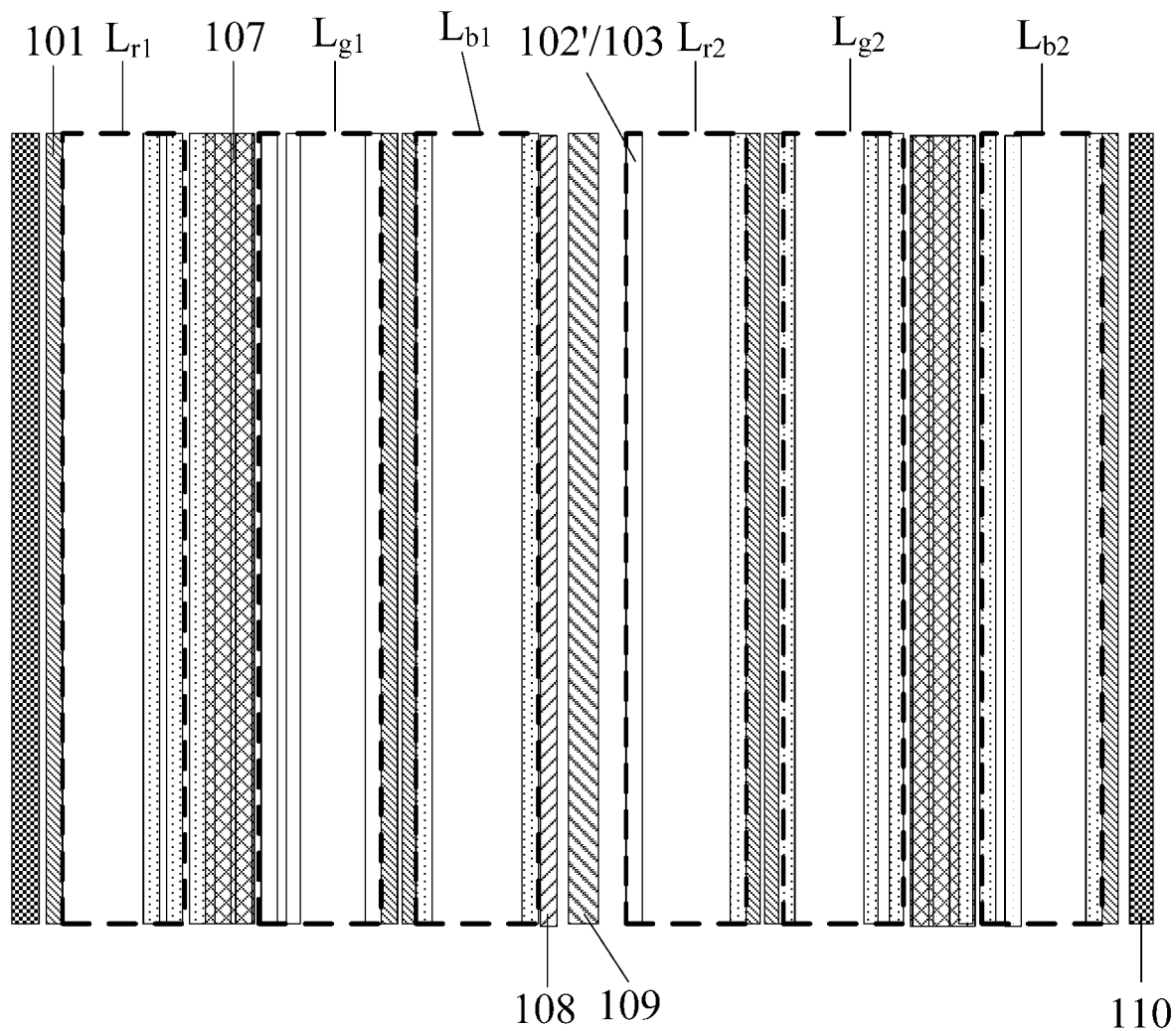
FIG. 26 is another schematic diagram of wiring of different signal lines in the region Z or region Z' shown in FIG. 2.
Figure 27:
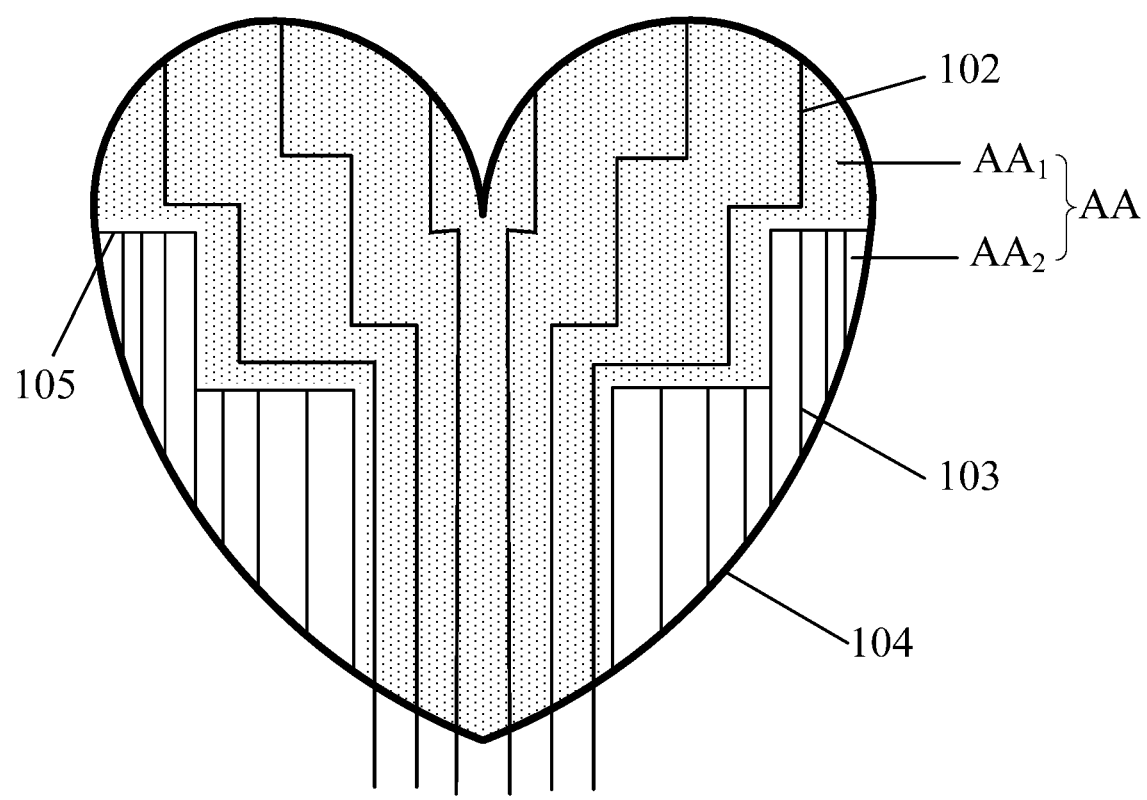
FIG. 27 is another schematic structural diagram of the display substrate according to an embodiment of the disclosure.
Figure 28:
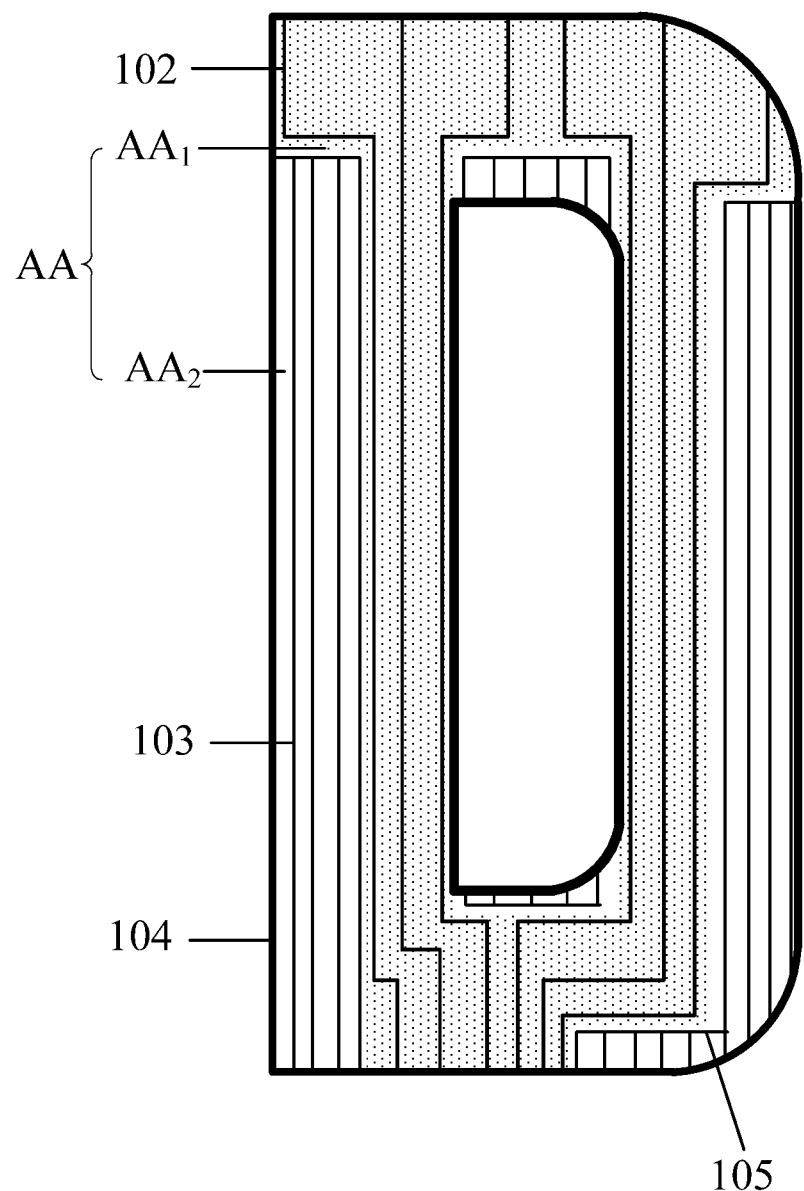
FIG. 28 is another schematic structural diagram of the display substrate according to an embodiment of the disclosure.
Figure 29:
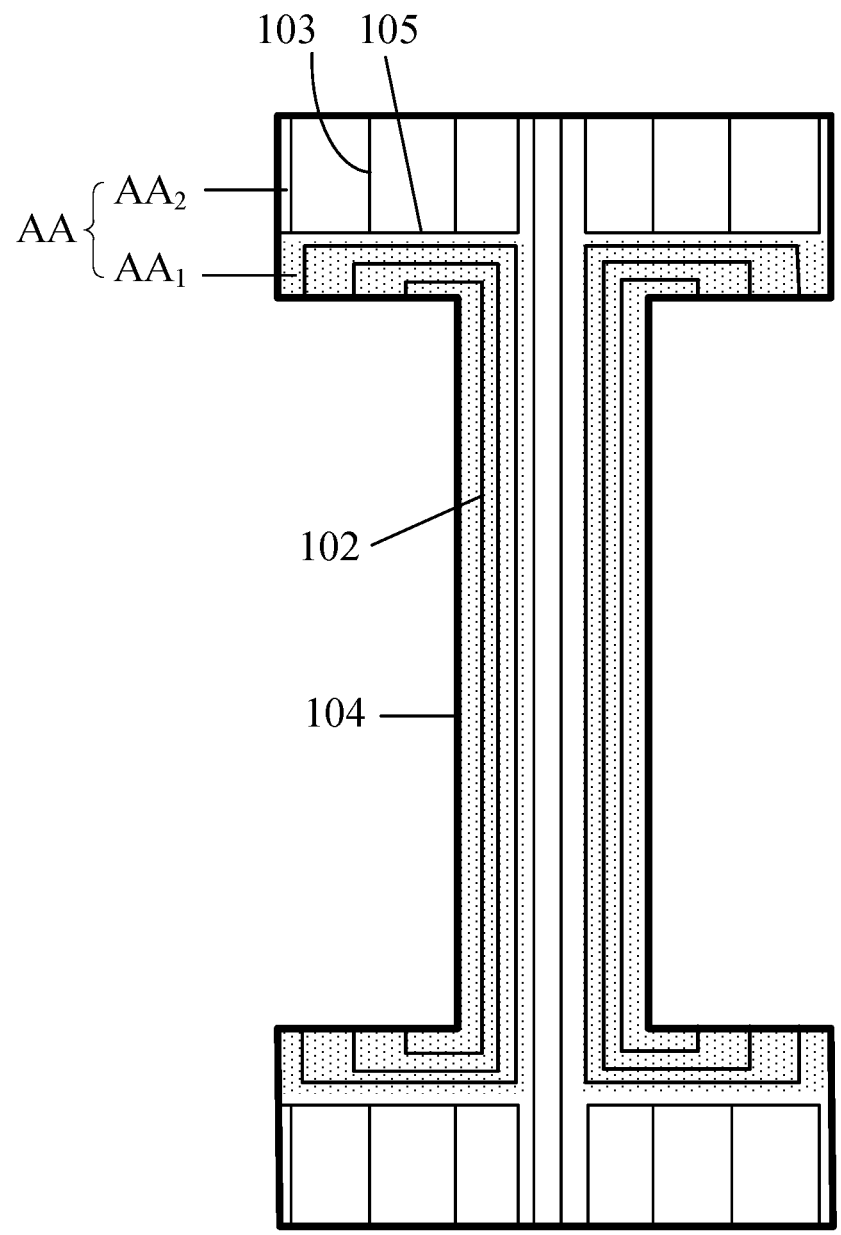
FIG. 29 is another schematic structural diagram of the display substrate according to an embodiment of the disclosure.
Figure 30:
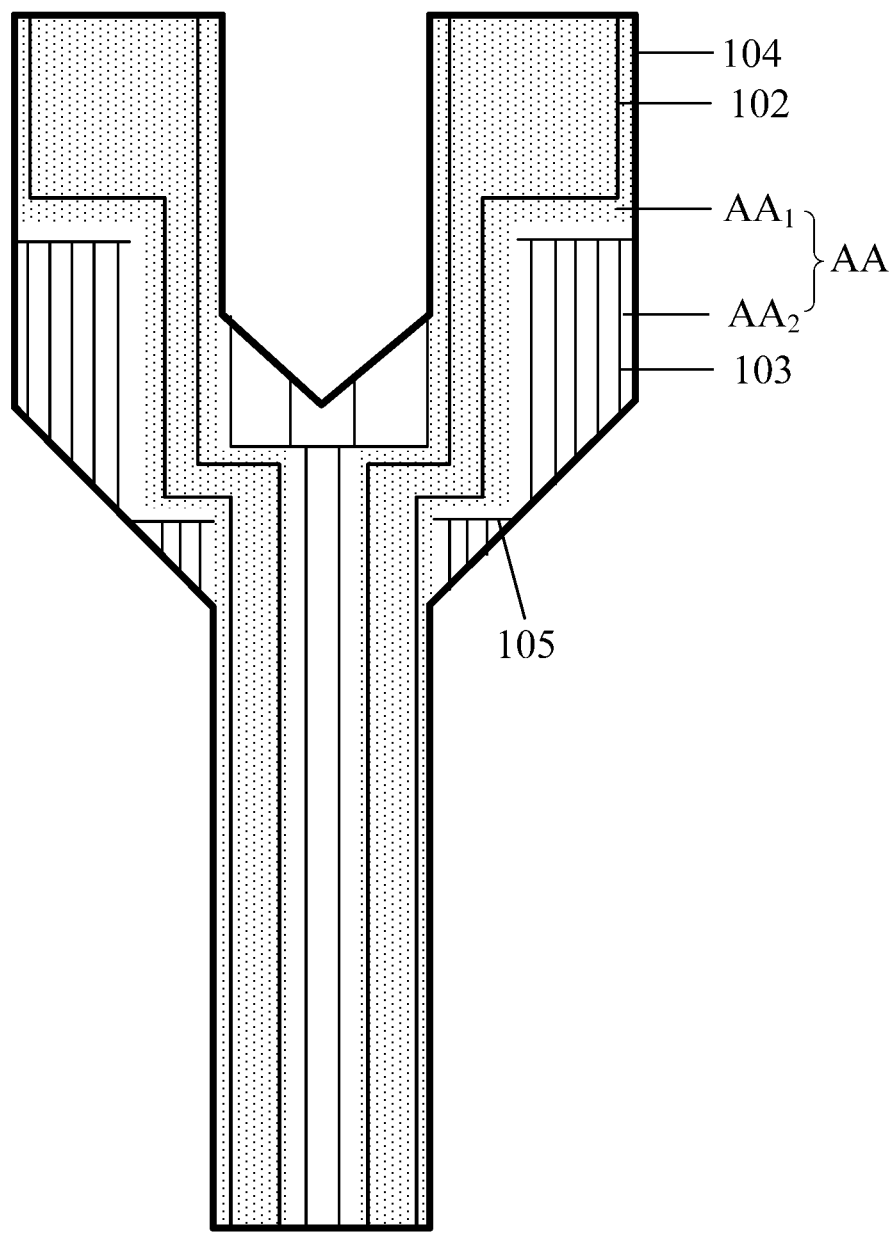
FIG. 30 is another schematic structural diagram of the display substrate according to an embodiment of the disclosure.

In some embodiments, in the above display substrate according to the embodiment of the disclosure, as shown in FIG. 26, the orthographic projections of the fan-out line segments 102' on the base substrate 100 and/or the orthographic projections of the plurality of dummy leads 103 on the base substrate 100 may also at least partially overlap with the orthographic projections of the plurality of gate drive signal lines 107 on the base substrate 100, so that the design of the fan-out lines 102 in the related art can continue to be used, and only the design of the dummy leads 103 is newly added.

In some embodiments, in the above display substrate according to the embodiment of the disclosure, as shown in FIG. 26, the orthographic projections of the fan-out line segments 102' on the base substrate 100 and the orthographic projections of the plurality of dummy leads 103 on the base substrate 100 do not overlap with an orthographic projection of the data line 101 on the base substrate 100 respectively, to prevent the formation of coupling capacitances between the fan-out line segments 102' and dummy leads 106 and the data line 101.

In some embodiments, in the above display substrate according to the embodiment of the disclosure, as shown in FIG. 26, in order to enable the orthographic projections of the fan-out line segments 102' and/or the dummy leads 103 on the base substrate 100 to also at least partially overlap with the orthographic projections of the gate drive signal lines 107 on the base substrate 100 and not overlap with the orthographic projection of the data line 101 on the base substrate 100, in the first display area $AA_1$, the orthographic projections of the fan-out line segments 102' on the base substrate 100 at least partially overlap with the orthographic projections of the edge areas of columns of sub-pixels on the base substrate 100, and the orthographic projections of the plurality of fan-out lines 102 on the base substrate 100 at least partially overlap with the orthographic projections of the column gaps provided with the gate drive signal lines 107 on the base substrate 100; and in the display area $AA_2$, the orthographic projections of the plurality of dummy leads 103 on the base substrate 100 at least partially overlap with the orthographic projections of the edge areas of columns of sub-pixels on the base substrate 100, and the orthographic projections of the plurality of dummy leads 103 on the base substrate 100 at least partially overlap with the orthographic projections of the column gaps provided with the gate drive signal lines 107 on the base substrate 100.

In some embodiments, in the above display substrate according to the embodiment of the disclosure, the plurality of gate drive signal lines 107 may be arranged in the same layer as the plurality of data lines 101, to complete the fabrication of the gate drive signal lines 107 and the data lines 101 through one mask process, and thus save one mask process, which is beneficial to improve the production efficiency and reduce the production cost.

In some embodiments, in the above display substrate according to the embodiment of the disclosure, as shown in FIG. 25 and FIG. 26, the gate drive signal line 107 and the data line 101 are located at different column gaps of columns of sub-pixels (e.g., $L_{r1}$, $L_{g1}$, $L_{b1}$, $L_{r2}$, $L_{g2}$, $L_{b2}$), so as to avoid short-circuiting between the gate drive signal line 107 and the data line 101 due to the close distance when the gate drive signal line 107 and the data line 101 are at the same column gap.

In some embodiments, in the above display substrate according to the embodiment of the disclosure, as shown in FIG. 24 to FIG. 26, every two adjacent columns of sub-pixels form a group, each column of sub-pixels are electrically connected to one data line 101, two data lines 101 corresponding to each group of sub-pixels are located at a column gap between two columns of sub-pixels in the group; and the gate drive signal lines 107 are located at group gaps arranged at intervals among the groups of sub-pixels. In FIG. 24 to FIG. 26, the columns of sub-pixels from left to right may be a first column of red sub-pixel $L_{r1}$, a first column of green sub-pixel $L_{g1}$, a first column of blue sub-pixel $L_{b1}$, a second column of red sub-pixel $L_{r2}$, a second column of green sub-pixels $L_{g2}$, and a second column of blue sub-pixels $L_{b2}$, where the first column of red sub-pixels $L_{r1}$ and a column of blue sub-pixels to its left (not shown in the figure) may be marked as a first group, the first column of green sub-pixels $L_{g1}$ and the first column of blue sub-pixels $L_{b1}$ are marked as a second group, the second column of red sub-pixels $L_{r2}$ and the second column of green sub-pixels $L_{g2}$ are marked as a third group, and the second column of blue sub-pixels $L_{b2}$ and a column of red sub-pixels to its right (not shown in the figure) are marked as a fourth group; the data lines 101 electrically connected to the first column of red sub-pixels $L_{r1}$ and a column of blue sub-pixels to its left (not shown in the figure) respectively are arranged at the column gap in the first group, the data lines 101 electrically connected to the first column of green sub-pixels $L_{g1}$ and the first column of blue sub-pixels $L_{b1}$ respectively are arranged at the column gap in the second group, the data lines 101 electrically connected to the second column of red sub-pixels $L_{r2}$ and the second column of green sub-pixels $L_{g2}$ respectively are arranged at the column gap in the third group, and the data lines 101 electrically connected to the second column of blue sub-pixels $L_{b2}$ and a column of red sub-pixels to its right (not shown in the figure) respectively are arranged at the column gap in the fourth group; the gate drive signal lines 107 are arranged at the group gap of the first group and the second group, and the group gap of the third group and the fourth group. Optionally, a reference signal line (Vref) 108 and an initialization signal line (Vin) 109 in the same layer as the data lines 101 may be arranged at the group gap between the second group and the third group; and a second power line 110 (for example, a high-level power line VDD) between two data lines 101 and in the same layer as the data lines 101 is arranged in the column gaps within the first group and the fourth group. In some embodiments, the reference signal line 108 may be electrically connected to the chip on film through the fan-out line 102. It should be understood that, in order to avoid the signal crosstalk, the reference signal line 108 and the data line 101 are respectively electrically connected to different fan-out lines 102.

In some embodiments, in the above display substrate according to the embodiment of the disclosure, as shown in FIG. 2, FIG. 27 to FIG. 30, the shape of the special-shaped display area AA is a pattern (such as heart), a letter (such as D, I, Y, etc.), a digit or a Chinese character. During specific implementation, the shape of the special-shaped display area AA can be designed according to actual needs, which is not specifically limited herein.

In some embodiments, the above display substrate according to the embodiment of the disclosure, as shown in FIG. 3, FIG. 4 and FIG. 18, may further include: a buffer layer 111, a first gate insulating layer 112, a second gate insulating layer 113, an interlayer dielectric layer 114, a first flat layer 115, a first insulating layer 116, a second insulating layer 117, a second flat layer 118, a pixel defining layer 119, a luminescent functional layer 120, a cathode 121, a transistor TFT, a storage capacitor Cst, etc. The luminescent functional layer 120 includes but not limited to a hole injection layer, a hole transport layer, an electron blocking layer, a luminescent material layer, a hole blocking layer, an electron transport layer, and an electron injection layer. The transistor TFT may be a thin film transistor or a metal oxide semiconductor field effect transistor; and the transistor TFT may be a top-gate transistor, a bottom-gate transistor or a double-gate transistor, which is not limited herein. All of other indispensable components of the display substrate should be understood by those ordinary skilled in the art to be included, and will be omitted here and should not be considered as limitations on the disclosure.

Figure 31:
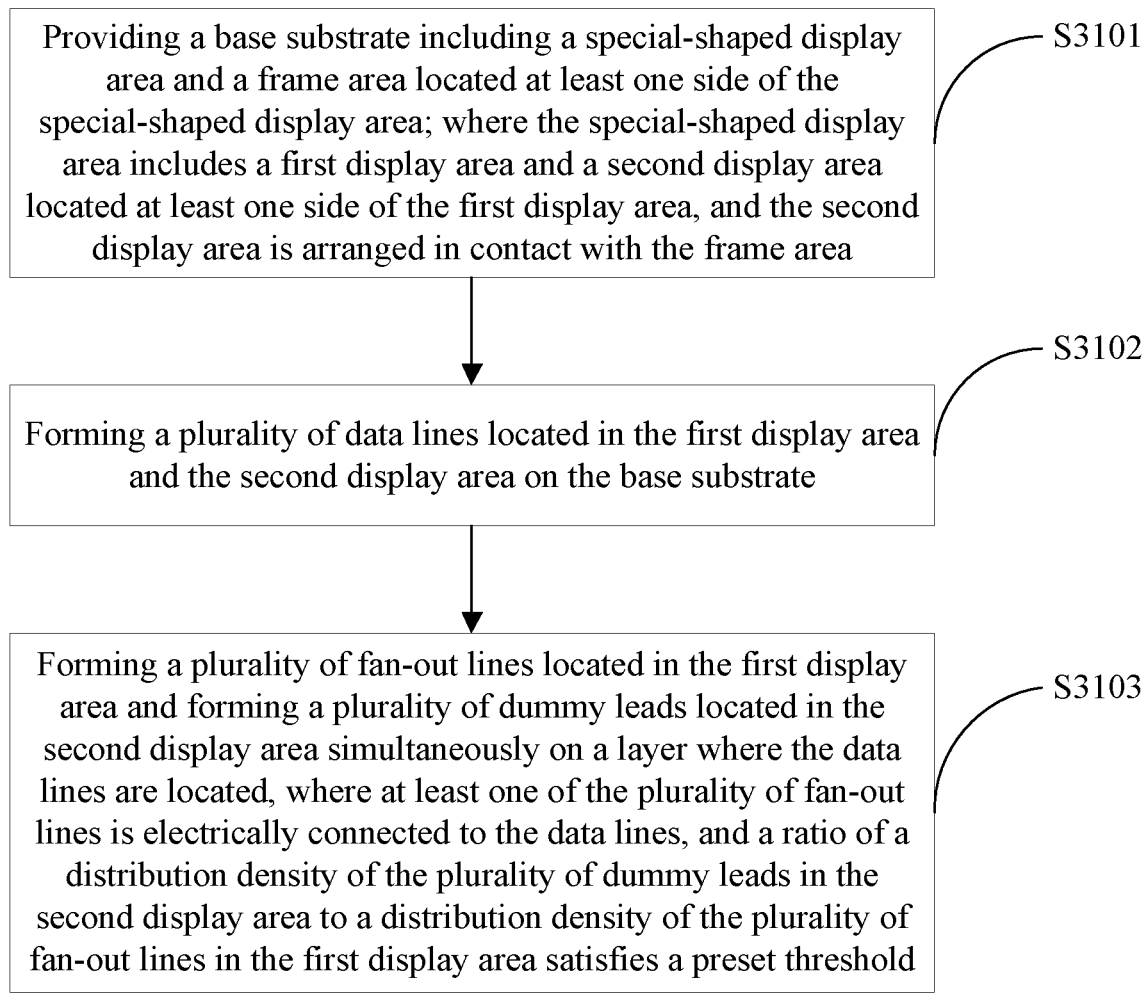
FIG. 31 is a flowchart of a manufacturing method for a display substrate according to an embodiment of the disclosure.

Based upon the same inventive concept, an embodiment of the disclosure provides a manufacturing method for the above display substrate, as shown in FIG. 31, which may include the following S3101 to S3103.

S3101: providing a base substrate including a special-shaped display area and a frame area located on at least one side of the special-shaped display area; where the special-shaped display area includes a first display area and a second display area located on at least one side of the first display area, and the second display area is arranged in contact with the frame area.

S3102: forming a data line located in the first display area and the second display area on the base substrate.

S3103: forming a plurality of fan-out lines located in the first display area and forming a plurality of dummy leads located in the second display area simultaneously on a layer where the data line is located, where at least one of the plurality of fan-out lines is electrically connected to the data line, and a ratio of a distribution density of the plurality of dummy leads in the second display area to a distribution density of the plurality of fan-out lines in the first display area satisfies a preset threshold.

Based on the same inventive concept, an embodiment of the disclosure provides a display device, including the above display substrate provided by the embodiments of the disclosure. Since the principle of the display device to solve the problem is similar to the principle of the above display substrate to solve the problem, the implementations of the display device provided in the embodiment of the disclosure can refer to the implementations of the above display substrate provided by the embodiments of the disclosure, and the repeated description thereof will be omitted.

In some embodiments, the above display device according to the embodiment of the disclosure may be: mobile phone, tablet computer, television, display, notebook computer, digital photo frame, navigator, smart watch, fitness wristband, personal digital assistant, and any other product or component with display function. The display device includes but not limited to: a radio frequency unit, a network module, an audio output & input unit, a sensor, a display unit, a user input unit, an interface unit, a memory, a processor, a power supply, etc. Furthermore, those skilled in the art can understand that the above-mentioned structure does not constitute a limitation on the above display device provided in the embodiment of the disclosure. In other words, the above display device provided in the embodiment of the disclosure may include more or fewer components than the above components, or combine certain components, or use different component arrangements.

Evidently, those skilled in the art can make various modifications and variations to the embodiments of the disclosure without departing from the spirit and scope of the embodiments of the disclosure. Thus, the disclosure is also intended to encompass these modifications and variations to the embodiments of the disclosure as long as these modifications and variations come into the scope of the claims of the disclosure and their equivalents.

What is claimed is:

1. A display substrate, comprising:
    a base substrate comprising a special-shaped display area and a frame area located on at least one side of the special-shaped display area; wherein the special-shaped display area comprises a first display area and a second display area located on at least one side of the first display area, and the second display area is arranged in contact with the frame area;
    a data line located on the base substrate and located in the first display area and the second display area;
    a plurality of fan-out lines located on a side of a layer where the data line is located away from the base substrate, and located in the first display area, wherein at least one of the plurality of fan-out lines is electrically connected to the data line; and
    a plurality of dummy leads arranged in a same layer as the plurality of fan-out lines and located in the second display area, wherein a ratio of a distribution density of the plurality of dummy leads in the second display area to a distribution density of the plurality of fan-out lines in the first display area satisfies a preset threshold.

2. The display substrate according to claim 1, wherein the preset threshold is greater than or equal to 0.5 and less than or equal to 1.5.

3. The display substrate according to claim 2, wherein the preset threshold is greater than or equal to 0.8 and less than or equal to 1.2.

4. The display substrate according to claim 3, wherein the preset threshold is 1.

5. The display substrate according to claim 1, further comprising: a first power line located in the frame area and electrically connected to the plurality of dummy leads.

6. The display substrate according to claim 5, wherein the first power line and the plurality of dummy leads form a closed loop;
    wherein the display substrate further comprises: a connection line arranged in a same layer as the plurality of dummy leads, wherein the plurality of dummy leads form a closed loop with the first power line through the connection line.

7. The display substrate according to claim 5, wherein the first power line is located at least in a layer where the plurality of dummy leads are located, and the first power line is integral with the plurality of dummy leads.

8. The display substrate according to claim 1, further comprising a gate drive circuit located in the special-shaped display area.

9. The display substrate according to claim 8, wherein the gate drive circuit comprises a plurality of shift registers arranged in cascade, and the plurality of shift registers are symmetrically arranged about a center axis of the special-shaped display area in a column direction.

10. The display substrate according to claim 9, further comprising a plurality of sub-pixels arranged in an array in the special-shaped display area; wherein the plurality of shift registers are arranged in cascade at row gaps of rows of the sub-pixels along the column direction.

11. The display substrate according to claim 8, further comprising a plurality of gate drive signal lines located in the first display area and the second display area and configured to provide control signals to the gate drive circuit.

12. The display substrate according to claim 11, wherein the plurality of fan-out lines comprise fan-out line segments with a substantially same extending direction as the data line, and an extending direction of the plurality of gate drive signal lines is substantially same as an extending direction of the data line; and
    orthographic projections of the fan-out line segments on the base substrate do not overlap with orthographic projections of the plurality of gate drive signal lines on the base substrate.

13. The display substrate according to claim 12, wherein an extending direction of the plurality of dummy leads is substantially same as the extension direction of the data line; and orthographic projections of the plurality of dummy leads on the base substrate do not overlap with the orthographic projections of the plurality of gate drive signal lines on the base substrate.

14. The display substrate according to claim 13, further comprising a plurality of sub-pixels arranged in an array in the special-shaped display area, wherein each column of the sub-pixels comprises an edge area adjacent to a column gap;
the gate drive signal lines are located at some column gaps of columns of the sub-pixels;
in the first display area, the orthographic projections of the fan-out line segments on the base substrate at least partially overlap with orthographic projections of edge areas on the base substrate, and the orthographic projections of the fan-out line segments on the base substrate at least partially overlap with orthographic projections of other column gaps than the some column gaps on the base substrate; and
in the second display area, the orthographic projections of the plurality of dummy leads on the base substrate at least partially overlap with the orthographic projections of the edge areas on the base substrate, and the orthographic projections of the plurality of dummy leads on the base substrate at least partially overlap with the orthographic projections of other column gaps than the some column gaps on the base substrate.

15. The display substrate according to claim 13, wherein in the first display area, the orthographic projections of the fan-out line segments on the base substrate are substantially evenly distributed among the orthographic projections of the gate drive signal lines on the base substrate; and
in the second display area, the orthographic projections of the dummy leads on the base substrate are substantially evenly distributed among the orthographic projections of the gate drive signal lines on the base substrate.

16. The display substrate according to claim 11, wherein the plurality of fan-out lines comprise fan-out line segments with a substantially same extending direction as the data line, an extending direction of the plurality of dummy leads is substantially same as an extending direction of the data line, and an extending direction of the plurality of gate drive signal lines is substantially same as the extending direction of the data line; and
orthographic projections of the fan-out line segments on the base substrate and/or orthographic projections of the plurality of dummy leads on the base substrate at least partially overlap with orthographic projections of the plurality of gate drive signal lines on the base substrate.

17. The display substrate according to claim 16, wherein the orthographic projections of the fan-out line segments on the base substrate and the orthographic projections of the plurality of dummy leads on the base substrate do not overlap with an orthographic projection of the data line on the base substrate respectively.

18. The display substrate according to claim 11, further comprising a plurality of sub-pixels arranged in an array in the special-shaped display area, wherein every two adjacent columns of sub-pixels form a group, each column of sub-pixels are electrically connected to one data line, two data lines corresponding to each group of sub-pixels are located at a column gap between two columns of sub-pixels in the group; the plurality of gate drive signal lines are arranged in a same layer as the data line, and the gate drive signal lines are located at group gaps arranged at intervals among groups of sub-pixels;
wherein a shape of the special-shaped display area is a pattern, a letter, a digit or a Chinese character.

19. A manufacturing method for the display substrate according to claim 1, comprising:
providing the base substrate comprising the special-shaped display area and the frame area located on at least one side of the special-shaped display area; wherein the special-shaped display area comprises the first display area and the second display area located on at least one side of the first display area, and the second display area is arranged in contact with the frame area;
forming the data line located in the first display area and the second display area on the base substrate; and
forming the plurality of fan-out lines located in the first display area and forming the plurality of dummy leads located in the second display area simultaneously on the layer where the data line is located, wherein at least one of the plurality of fan-out lines is electrically connected to the data line, and the ratio of the distribution density of the plurality of dummy leads in the second display area to the distribution density of the plurality of fan-out lines in the first display area satisfies the preset threshold.

20. A display device, comprising a display substrate, wherein the display substrate comprises:
a base substrate comprising a special-shaped display area and a frame area located on at least one side of the special-shaped display area; wherein the special-shaped display area comprises a first display area and a second display area located on at least one side of the first display area, and the second display area is arranged in contact with the frame area;
a data line located on the base substrate and located in the first display area and the second display area;
a plurality of fan-out lines located on a side of a layer where the data line is located away from the base substrate, and located in the first display area, wherein at least one of the plurality of fan-out lines is electrically connected to the data line; and
a plurality of dummy leads arranged in a same layer as the plurality of fan-out lines and located in the second display area, wherein a ratio of a distribution density of the plurality of dummy leads in the second display area to a distribution density of the plurality of fan-out lines in the first display area satisfies a preset threshold.

* * * * *